(12) United States Patent
Irons et al.

(10) Patent No.: US 11,296,467 B2
(45) Date of Patent: *Apr. 5, 2022

(54) HIGH OUTLET DENSITY POWER DISTRIBUTION UNIT

(71) Applicant: Server Technology, Inc., Reno, NV (US)

(72) Inventors: Travis Irons, Reno, NV (US); James P. Maskaly, Reno, NV (US); Peter Giammona, Reno, NV (US); Mark Ramsey, Reno, NV (US)

(73) Assignee: Server Technology, Inc., Reno, NV (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/884,807

(22) Filed: May 27, 2020

(65) Prior Publication Data

US 2020/0287336 A1 Sep. 10, 2020

Related U.S. Application Data

(63) Continuation of application No. 16/577,968, filed on Sep. 20, 2019, now Pat. No. 11,133,626, which is a
(Continued)

(51) Int. Cl.
*H01R 25/00* (2006.01)
*H05K 7/14* (2006.01)
(Continued)

(52) U.S. Cl.
CPC .......... *H01R 25/003* (2013.01); *G01R 21/00* (2013.01); *H01R 13/46* (2013.01); *H01R 25/006* (2013.01);
(Continued)

(58) Field of Classification Search
CPC ...... G01R 21/00; H01R 13/46; H01R 13/514; H01R 13/518; H01R 13/52; H01R 13/627;
(Continued)

(56) References Cited

U.S. PATENT DOCUMENTS 1,879,783 A 9/1932 Barnett
3,214,579 A 10/1965 Pacini
(Continued)

FOREIGN PATENT DOCUMENTS

CA 2713428 A1 7/2009
CA 2837880 A1 12/2012
(Continued)

OTHER PUBLICATIONS

International Search Report and Written Opinion of International Application No. PCT/US2013/068811; dated Feb. 27, 2014; 15 pages.
(Continued)

*Primary Examiner* — Travis S Chambers
(74) *Attorney, Agent, or Firm* — Perkins Coie LLP

(57) ABSTRACT

Systems and apparatuses are provided in which outlets are coupled to a power distribution unit (PDU) or PDU module in various configurations. The outlets may be coupled to a recessed surface within a PDU housing. The outlets may be coupled to a printed circuit board that is at least partially disposed within the PDU housing. The outlets may extend away from the recessed surface or printed circuit board towards or beyond a front face of the PDU housing.

17 Claims, 17 Drawing Sheets

Related U.S. Application Data continuation of application No. 15/418,255, filed on Jan. 27, 2017, now Pat. No. 10,424,884, which is a continuation of application No. 14/687,670, filed on Apr. 15, 2015, now Pat. No. 9,583,902, which is a continuation-in-part of application No. 14/073,769, filed on Nov. 6, 2013, now Pat. No. 9,484,692.

(60) Provisional application No. 61/723,065, filed on Nov. 6, 2012.

(51) Int. Cl.

| | | |
|---|---|---|
| *H02J 3/00* | (2006.01) | |
| *H01R 27/02* | (2006.01) | |
| *G01R 21/00* | (2006.01) | |
| *H02B 1/20* | (2006.01) | |
| *H01R 13/46* | (2006.01) | |
| *H02G 11/02* | (2006.01) | |
| *H01R 13/518* | (2006.01) | |
| *H01R 13/64* | (2006.01) | |

(52) U.S. Cl.
CPC ............ *H01R 27/02* (2013.01); *H02B 1/20* (2013.01); *H02J 3/005* (2013.01); *H02J 3/007* (2020.01); *H05K 7/1492* (2013.01); *H01R 13/518* (2013.01); *H01R 13/64* (2013.01); *H02G 11/02* (2013.01)

(58) Field of Classification Search
CPC .... H01R 13/6273; H01R 13/64; H01R 13/66; H01R 13/73; H01R 13/74; H01R 25/003; H01R 25/006; H01R 27/02; H02B 1/20; H02G 11/02; H02J 3/005; H02J 3/007; H05K 7/1492; H05K 7/20; H05K 7/20554; H05K 7/20718; Y02B 90/20; Y02B 80/10; Y04S 20/00
USPC ........................................................ 439/652
See application file for complete search history.

(56) References Cited

U.S. PATENT DOCUMENTS

| | | | |
|---|---|---|---|
| 3,478,295 | A | 11/1969 | Grieshaber |
| 3,651,443 | A | 3/1972 | Quilez |
| 3,659,252 | A | 4/1972 | Brown |
| D279,285 | S | 6/1985 | Schwartz |
| 4,684,186 | A | 8/1987 | Hetherington |
| 4,911,652 | A | 3/1990 | Savoca et al. |
| 5,285,011 | A | 2/1994 | Shimochi |
| 5,328,388 | A | 7/1994 | Fust et al. |
| 5,418,328 | A | 5/1995 | Nadeau |
| 5,429,518 | A | 7/1995 | Chen |
| 5,603,638 | A | 2/1997 | Brown et al. |
| 5,775,935 | A | 7/1998 | Barna |
| 5,793,352 | A | 8/1998 | Greenberg et al. |
| D409,978 | S | 5/1999 | Stekelenburg |
| 6,024,588 | A | 2/2000 | Hsu et al. |
| 6,030,249 | A * | 2/2000 | Illg .................... H01R 13/6275 439/353 |
| D425,863 | S | 5/2000 | Yu |
| 6,095,852 | A | 8/2000 | Gregory, II |
| D433,386 | S | 11/2000 | Veino et al. |
| 6,220,880 | B1 | 4/2001 | Lee et al. |
| 6,256,881 | B1 | 7/2001 | Starkey |
| D447,119 | S | 8/2001 | Lee |
| 6,283,787 | B1 | 9/2001 | Chou |
| 6,437,664 | B1 | 8/2002 | Meppelink et al. |
| D469,062 | S | 1/2003 | Nieto et al. |
| 6,573,617 | B2 | 6/2003 | Jones et al. |
| 6,602,081 | B1 | 8/2003 | Wang |
| 6,642,450 | B1 | 11/2003 | Hsiao |
| 6,750,410 | B2 | 6/2004 | Lee |
| 6,830,477 | B2 | 12/2004 | Vander Vorste et al. |
| 6,867,966 | B2 | 3/2005 | Smith et al. |
| D507,237 | S | 7/2005 | Gregory |
| 6,937,461 | B1 | 8/2005 | Donahue |
| D512,687 | S | 12/2005 | Baker et al. |
| 6,986,676 | B1 | 1/2006 | Tronolone et al. |
| D519,927 | S | 5/2006 | Sung et al. |
| 7,043,543 | B2 | 5/2006 | Ewing et al. |
| 7,094,077 | B1 | 8/2006 | Chen |
| 7,101,215 | B2 | 9/2006 | Woellner et al. |
| D537,041 | S | 2/2007 | Chesebro et al. |
| D544,845 | S | 6/2007 | Askeland et al. |
| 7,264,514 | B2 | 9/2007 | Hsu et al. |
| D559,185 | S | 1/2008 | Waedeled |
| 7,347,734 | B1 | 3/2008 | Teitelbaum |
| 7,457,106 | B2 | 11/2008 | Ewing et al. |
| 7,488,204 | B2 | 2/2009 | Hsu |
| 7,510,426 | B2 | 3/2009 | Hwang et al. |
| 7,597,578 | B2 | 10/2009 | Adunka et al. |
| 7,607,928 | B2 | 10/2009 | Schriefer et al. |
| D610,092 | S | 2/2010 | Jimenez et al. |
| 7,753,699 | B2 | 7/2010 | Wu |
| 7,758,376 | B2 | 7/2010 | Hwang et al. |
| 7,768,794 | B1 | 8/2010 | Wilson et al. |
| 7,845,974 | B2 | 12/2010 | Yue et al. |
| 7,857,654 | B2 | 12/2010 | West et al. |
| 7,874,856 | B1 | 1/2011 | Schriefer et al. |
| D633,045 | S | 2/2011 | Cullen et al. |
| D636,335 | S | 4/2011 | Clark |
| D636,345 | S | 4/2011 | Cullen et al. |
| 7,961,111 | B2 | 6/2011 | Tinaphong et al. |
| 7,990,689 | B2 | 8/2011 | Ewing et al. |
| 8,011,940 | B1 | 9/2011 | Wu |
| 8,033,867 | B1 * | 10/2011 | Kessler .................. H01R 25/14 439/652 |
| 8,038,454 | B2 * | 10/2011 | Jiang .................... H01R 25/003 439/106 |
| 8,052,437 | B2 | 11/2011 | Jiang et al. |
| 8,062,049 | B2 | 11/2011 | Tobey |
| 8,118,616 | B1 | 2/2012 | Clark |
| 8,138,634 | B2 | 3/2012 | Ewing et al. |
| 8,157,574 | B2 | 4/2012 | Hsiao et al. |
| 8,206,185 | B2 | 6/2012 | Jehmlich et al. |
| 8,207,627 | B2 | 6/2012 | Aldag et al. |
| 8,212,427 | B2 | 7/2012 | Spitaels et al. |
| D667,795 | S | 9/2012 | Zien et al. |
| 8,283,802 | B2 | 10/2012 | Jansma et al. |
| 8,321,163 | B2 | 11/2012 | Ewing et al. |
| 8,338,708 | B2 | 12/2012 | Maebashi et al. |
| D673,503 | S | 1/2013 | Lee et al. |
| 8,376,782 | B2 | 2/2013 | Govekar |
| D677,630 | S | 3/2013 | Zien et al. |
| 8,427,283 | B2 | 4/2013 | Lee et al. |
| D682,213 | S | 5/2013 | Byrne et al. |
| 8,439,697 | B2 | 5/2013 | Vass |
| 8,469,734 | B2 | 6/2013 | Chen |
| 8,471,718 | B1 | 6/2013 | Miller et al. |
| 8,491,343 | B2 | 7/2013 | Wang et al. |
| 8,494,661 | B2 | 7/2013 | Ewing et al. |
| D693,769 | S | 11/2013 | Picard et al. |
| D693,770 | S | 11/2013 | Miller |
| 8,587,950 | B2 | 11/2013 | Ewing et al. |
| 8,643,504 | B2 | 2/2014 | Marcinek |
| D701,834 | S | 4/2014 | Lee et al. |
| 8,702,447 | B2 | 4/2014 | Lau |
| 8,777,655 | B2 | 7/2014 | Blanton |
| 8,876,548 | B2 | 11/2014 | Doorhy et al. |
| 8,882,536 | B2 | 11/2014 | Utz |
| 9,054,449 | B2 | 6/2015 | Utz et al. |
| D734,253 | S | 7/2015 | Tinaphong et al. |
| 9,130,298 | B1 | 9/2015 | Baydoun |
| D746,234 | S | 12/2015 | Zien et al. |
| 9,246,317 | B2 | 1/2016 | Byrne et al. |
| 9,270,054 | B2 | 2/2016 | Beltzer |
| 9,325,129 | B2 | 4/2016 | Soneda et al. |
| 9,356,409 | B2 | 5/2016 | Jansma et al. |
| D759,596 | S | 6/2016 | Byrne et al. |
| 9,438,017 | B2 | 9/2016 | Irons et al. |
| 9,444,175 | B2 | 9/2016 | Chen |

(56) References Cited

U.S. PATENT DOCUMENTS

| | | | |
|---|---|---|---|
| 9,484,692 B2 | 11/2016 | Irons | |
| D780,122 S | 2/2017 | Irons et al. | |
| 9,583,902 B2* | 2/2017 | Irons | H05K 7/1492 |
| 9,614,335 B2* | 4/2017 | Irons | H01R 13/46 |
| 9,627,828 B2 | 4/2017 | Irons | |
| 9,692,178 B2 | 6/2017 | Hutchison et al. | |
| 9,727,515 B2 | 8/2017 | Whitney | |
| D797,676 S | 9/2017 | Xu | |
| 9,800,031 B2 | 10/2017 | Irons et al. | |
| 9,941,678 B2 | 4/2018 | Kawamura | |
| 9,991,633 B2* | 6/2018 | Robinet | H01R 13/6275 |
| 10,249,998 B2 | 4/2019 | Irons et al. | |
| 10,424,884 B2* | 9/2019 | Irons | G01R 21/00 |
| 10,424,885 B2* | 9/2019 | Irons | H02B 1/20 |
| 10,424,886 B1* | 9/2019 | Irons | H01R 25/006 |
| 10,498,096 B2 | 12/2019 | Irons et al. | |
| 10,541,501 B2* | 1/2020 | Hutchison | H01R 25/006 |
| 10,680,398 B1 | 6/2020 | Irons et al. | |
| 10,707,630 B2* | 7/2020 | Irons | H01R 27/02 |
| D920,917 S | 6/2021 | Irons et al. | |
| 2002/0195324 A1 | 12/2002 | Lee | |
| 2004/0077212 A1 | 4/2004 | Pulizzi | |
| 2006/0199438 A1 | 9/2006 | Cleveland | |
| 2006/0246784 A1 | 11/2006 | Aekins et al. | |
| 2007/0077825 A1 | 4/2007 | Kuo | |
| 2007/0128927 A1 | 6/2007 | Cleveland | |
| 2007/0161293 A1 | 7/2007 | Ewing et al. | |
| 2008/0076291 A1 | 3/2008 | Ewing et al. | |
| 2009/0061691 A1* | 3/2009 | Ewing | H01H 85/202 |
| | | | 439/654 |
| 2009/0137142 A1 | 5/2009 | Xia et al. | |
| 2009/0242265 A1 | 10/2009 | Doorhy et al. | |
| 2010/0090851 A1 | 4/2010 | Hauser | |
| 2010/0314943 A1* | 12/2010 | Jansma | H01R 25/006 |
| | | | 307/48 |
| 2011/0076882 A1 | 3/2011 | Fleisig | |
| 2011/0095901 A1 | 4/2011 | Marcinek | |
| 2011/0187348 A1 | 8/2011 | Soneda et al. | |
| 2011/0223784 A1 | 9/2011 | Jiang et al. | |
| 2012/0087051 A1 | 4/2012 | Spitaels et al. | |
| 2012/0190225 A1 | 7/2012 | Bessyo et al. | |
| 2013/0183851 A1 | 7/2013 | Takakura | |
| 2014/0041894 A1 | 2/2014 | Wang | |
| 2014/0144670 A1 | 5/2014 | Irons et al. | |
| 2015/0104968 A1 | 4/2015 | Hutchinson et al. | |
| 2015/0162706 A1 | 6/2015 | Kennedy et al. | |
| 2016/0079722 A1 | 3/2016 | Ewing et al. | |
| 2016/0149331 A1* | 5/2016 | Chen | H01R 13/465 |
| | | | 439/491 |
| 2021/0057859 A1 | 2/2021 | Irons et al. | |
| 2021/0159648 A1* | 5/2021 | Irons | G01R 21/00 |

FOREIGN PATENT DOCUMENTS

| | | |
|---|---|---|
| CN | 1941514 A | 4/2007 |
| CN | 201038489 Y | 3/2008 |
| CN | 201253210 Y | 6/2009 |
| CN | 201594673 U | 9/2010 |
| CN | 202019073 U | 10/2011 |
| CN | 102804519 A | 11/2012 |
| CN | 203377422 U | 1/2014 |
| CN | 103915712 A | 7/2014 |
| CN | 103928785 A | 7/2014 |
| CN | 104253334 A | 12/2014 |
| CN | 104466486 | 3/2015 |
| DE | 4411731 A1 | 10/1994 |
| DE | 102006002528 | 7/2007 |
| DE | 202016101189 U1 | 3/2016 |
| EP | 1039589 | 9/2000 |
| EP | 1107394 A | 6/2001 |
| EP | 1244184 | 9/2002 |
| EP | 1501158 | 1/2005 |
| GB | 1238813 A | 7/1971 |
| GB | 2255241 | 10/1992 |
| GB | 2469460 A | 10/2010 |
| JP | 53067076 U | 6/1978 |
| JP | S5367076 U1 | 6/1978 |
| JP | 04192277 A2 | 7/1992 |
| JP | H04341776 | 11/1992 |
| JP | 2045845 | 11/1997 |
| JP | 2003257523 A | 9/2003 |
| JP | 3102760 U | 7/2004 |
| JP | 2005071923 A | 3/2005 |
| JP | 2007022803 A | 2/2007 |
| JP | 2010074985 A | 4/2010 |
| JP | 2011229031 A | 11/2011 |
| JP | 2012063265 A | 3/2012 |
| JP | 2012099987 A | 5/2012 |
| KR | 20040002474 A | 1/2004 |
| WO | WO2010076144 | 7/2010 |
| WO | WO2012096677 | 7/2012 |
| WO | WO2013003300 | 1/2013 |
| WO | WO2015021960 | 2/2015 |
| WO | WO2015038945 A1 | 3/2015 |

OTHER PUBLICATIONS

International Preliminary Report on Patentability of International Application No. PCT/US2013/068811; dated Dec. 22, 2014; 4 pages.

Photographs of RCA Power Strip, taken on Jan. 26, 2016.

International Search Report and Written Opinion of International Application No. PCT/US2016/027228 dated Jul. 1, 2016, 8 pages.

Examination Report for Canadian Application No. 2,889,216; dated May 25, 2016; 5 pages.

Office Action for German Application No. 112013005294.6; dated Jan. 5, 2017; 17 pages.

Office Action for Canadian Patent Application No. 2,889,216; dated Aug. 9, 2017; 5 pages.

Examination Report No. 1 for Australian Patent Application No. 2016250353; dated Aug. 29, 2017; 4 pages.

Examination Report No. 1 for Australian Patent Application No. 2018264106; dated Jan. 22, 2020; 6 pages.

Examination Report for United Kingdom Application No. GB1506941.2; dated Aug. 31, 2017; 5 pages.

Third Office Action of Chinese Application No. 201380068692.7; dated Sep. 18, 2017; 20 pages.

Examination Report No. 1 for Australian Patent Application No. 2016250352: dated Oct. 5, 2017; 3 pages.

Japanese Office Action for Japanese Application No. 2017-093150; dated Jan. 9, 2018; 10 pages.

Examination Report for United Kingdom Application No. GB1506941.2; dated Apr. 23, 2018; 3 pages.

Final Rejection of Japanese Patent Application No. 2017-093150; dated Apr. 18, 2018; 5 pages.

First Examination Report of India Patent Application No. 1598/KOLNP/2015; dated Aug. 7, 2018; 6 pages.

Extended European Search Report for European Patent No. 16780598.5; dated Jan. 17, 2019; 5 pages.

Office Action for Chinese Application No. 201610228540.4; dated Jan. 29, 2019; 11 pages.

42U (Dec. 3, 2014) "3 Ways to Customize a Power Distribution Units," accessed Apr. 30, 2019, at https://www.42u.com/power/rack-pdu.htm.

Tripp (2011). Tripp Lite PDUs. Retrieved from https://www.anixter.com/content/dam/Suppliers/Tripp%20Lite/Brochures/05%20-%20Power%20Distribution%20Unit%20PDU%20Brochure.pdf.

Eaton Powerware (2008). Single Phase Systems—International TPC2365 Series. Retrieved from https://www.hmcragg.com/assets/files/Products/AC-Power-Solutions/Power-Distribution/Rack-Level-ePDU/TPC2365-EMO-EPO-1U-Eaton-Pulizzi-ePDU.pdf.

Eaton (Mar. 2012). Eaton ePDU Product Catalog. Retrieved from https://www.power-solutions.com/wp-content/uploads/2012/01/Eaton-ePDU-Brochure.pdf.

IBM Europe Announcement (Apr. 2008), "IBM Ultra Density family of power distribution units make it easy to protect and

(56) References Cited

OTHER PUBLICATIONS manage high-availability, rack-based systems," Retrieved from https://www-01.ibm.com/common/ssi/rep_ca/0/877/ENUSZG08-0290/ENUSZG08-0290.PDF.
Conteg Datasheet (May 2013). Intelligent & Basic Power Distribution Units (PDU). Retrieved from https://www.conteg.com/files/1/soubory/47/en/intelligent-basic-pdu-ds-2010-en-www.pdf.
Hewlett Packard, QuickSpecs (Mar. 2013). HP Basic Power Distribution Units. Retrieved from https://www.ikt-handel.no/pdf/AA314EB8-F83A-43D4-8DE0-95D10B401928.pdf.
IBM (2010). IBM 1U Switched and Monitored Power Distribution Units. Retrieved from http://www.arp.com/medias/546384e92f5ba94910979305.pdf.
Bernstein, et al., Dell Enterprise Systems, Dell White Paper, "Dell™ Rack Engineering, RapidPower PDU Best Practices," (Aug. 2002), 28 pages.
Anonymous (Jan./Feb. 2009). NEW Products. Connector Specifier; 25(1), SciTech Premium Collection, pp. 20-22.
Anonymous (Feb. 2005). What's New. Electrical Contracting Products; 8(2), pp. 26, 28. Retrieved from http://proxygw.wrlc.org/login?url=https://search.proquest.com/docview/228106148?accountid=11243.
First Office Action in Chinese Application No. 201610228540.4; dated Jan. 29, 2019; 34 pages.
Second Office Action in Chinese Application No. 201610228540.4; dated Sep. 29, 2019; 24 pages.
Examination Report for Australian Application No. 2018264106; dated Jan. 13, 2021; 4 pages.
Examination Report for European Application No. 16780598.5; dated Jul. 26, 2021; 5 pages.

\* cited by examiner

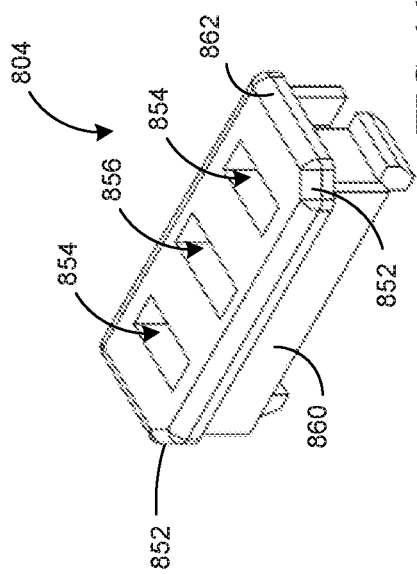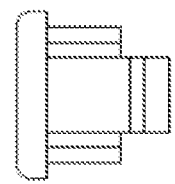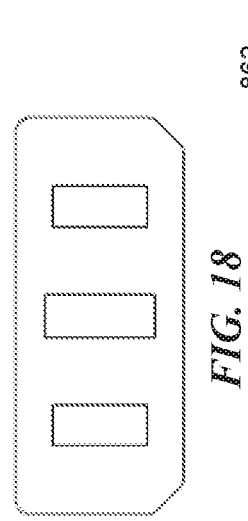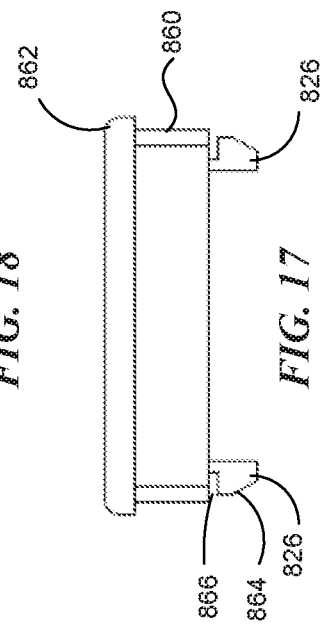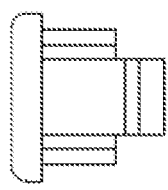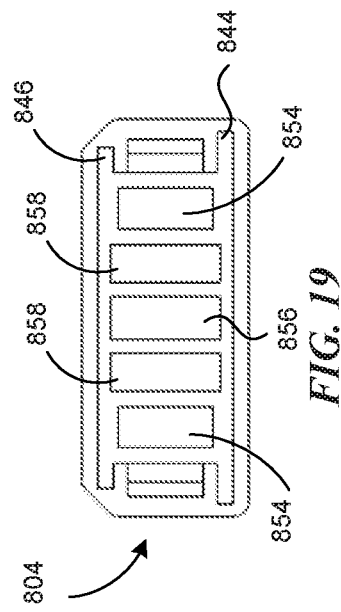

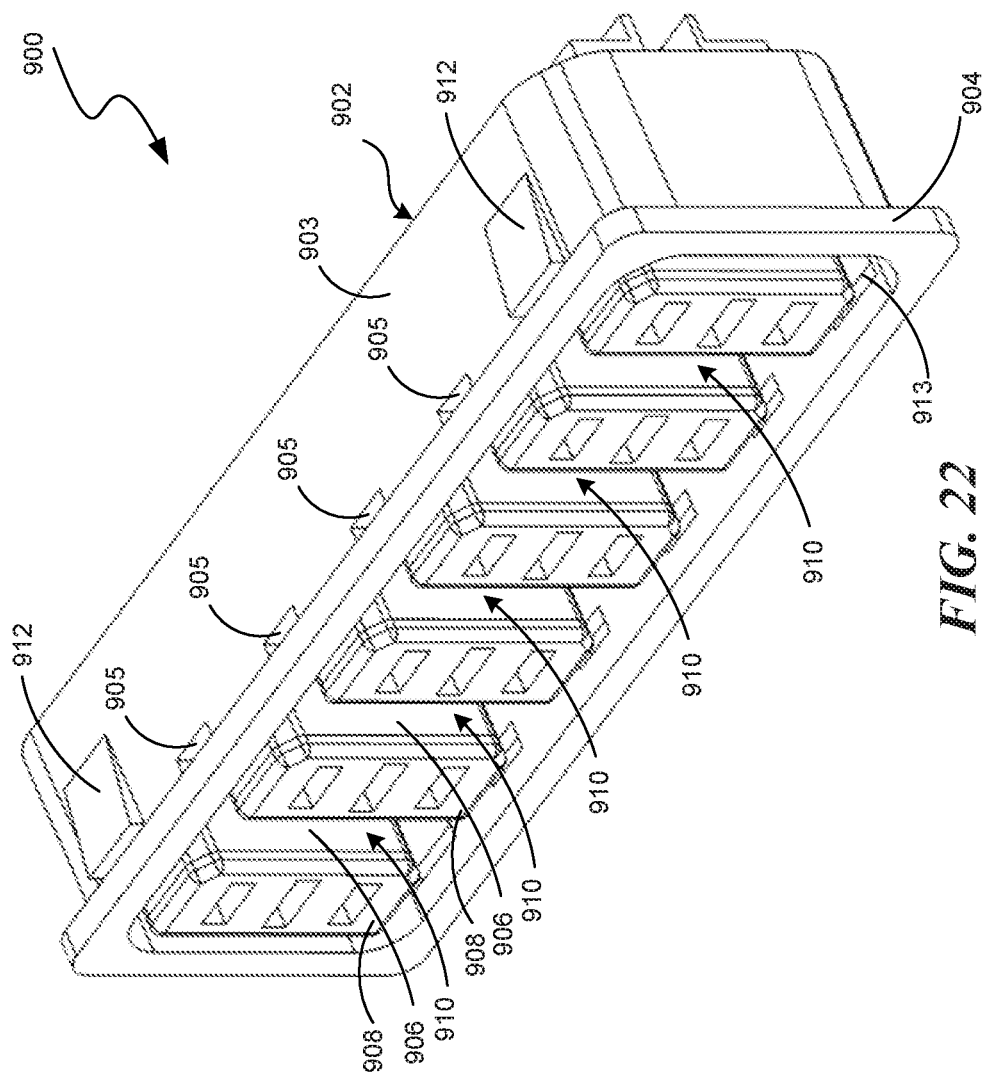

HIGH OUTLET DENSITY POWER DISTRIBUTION UNIT

CROSS-REFERENCE TO RELATED APPLICATION(S)

This application is a continuation of U.S. patent application Ser. No. 16/577,968, now U.S. Pat. No. 11,133,626, entitled "HIGH OUTLET DENSITY POWER DISTRIBUTION UNIT," filed Sep. 20, 2019, which is a continuation of U.S. patent application Ser. No. 15/418,255, entitled "HIGH OUTLET DENSITY POWER DISTRIBUTION UNIT," filed Jan. 27, 2017, now U.S. Pat. No. 10,424,844, which is a continuation of U.S. patent application Ser. No. 14/687,670, entitled "HIGH OUTLET DENSITY POWER DISTRIBUTION UNIT," filed Apr. 15, 2015, now U.S. Pat. No. 9,583,902, which is a continuation-in-part of U.S. patent application Ser. No. 14/073,769, now U.S. Pat. No. 9,484,692, entitled "HIGH OUTLET DENSITY POWER DISTRIBUTION," filed Nov. 6, 2013, which claims the benefit of and priority to U.S. Provisional Application Ser. No. 61/723,065, entitled "HIGH OUTLET DENSITY POWER DISTRIBUTION UNIT," filed Nov. 6, 2012, the entire disclosures of which are incorporated herein by reference.

TECHNICAL FIELD

The present disclosure is directed to power distribution units and, more specifically, to a power distribution unit having a high density of power outputs.

BACKGROUND

A conventional Power Distribution Unit (PDU) is an assembly of electrical outlets (also called receptacles) that receive electrical power from a source and distribute the electrical power to one or more separate electronic appliances. Each such PDU assembly has a power input that receives power from a power source, and power outlets that may be used to provide power to one or more electronic appliances. PDUs are used in many applications and settings such as, for example, in or on electronic equipment racks. One or more PDUs are commonly located in an equipment rack (or other cabinet), and may be installed together with other devices connected to the PDU such as environmental monitors, temperature and humidity sensors, fuse modules, or communications modules that may be external to or contained within the PDU housing. A PDU that is mountable in an equipment rack or cabinet may sometimes be referred to as a Cabinet PDU, or "CDU" for short.

A common use of PDUs is supplying operating power for electrical equipment in computing facilities, such as data centers or server farms. Such computing facilities may include electronic equipment racks that comprise rectangular or box-shaped housings sometimes referred to as a cabinet or a rack and associated components for mounting equipment, associated communications cables, and associated power distribution cables. Electronic equipment may be mounted in such racks so that the various electronic devices (e.g., network switches, routers, servers and the like) are aligned vertically, one on top of the other, in the rack. One or more PDUs may be used to provide power to the electronic equipment. Multiple racks may be oriented side-by-side, with each containing numerous electronic components and having substantial quantities of associated component wiring located both within and outside of the area occupied by the racks. Such racks commonly support equipment that is used in a computing network for an enterprise, referred to as an enterprise network.

As mentioned, many equipment racks may be located in a data center or server farm, each rack having one or more associated PDUs. Various different equipment racks may have different configurations, including different locations of and different densities of equipment within racks. One or more such data centers may serve as data communication hubs for an enterprise. As will be readily recognized, space within equipment racks is valuable with maximization of computing resources for any given volume being desirable.

SUMMARY

The evolution of computing equipment is toward higher electrical efficiency and smaller volume, resulting in higher densities of computing equipment within a rack that require an equivocal number of power outlets. For this reason, maximizing the density of outlets within a PDU is commercially advantageous. Present day commercially available C13 and C19 receptacles are not designed to maximize the outlet density within a PDU.

Apparatuses and devices are provided in the present disclosure that allow for relatively high density configurations of outlets in PDUs that may also provide plug retention mechanisms. In some aspects, a power distribution unit may be provided with one or more outlet banks that have a recessed surface relative to a front face of a PDU. A plurality of outlets in some embodiments extend away from the recessed surface, but do not extend beyond a plane of the front face of the PDU. The outlets may be built into a tray, which in some embodiments may be air-tight with respect to the internal area of the PDU containing measurement and distribution equipment, thus allowing active cooling solutions to more easily be employed as compared to traditional use of conventional outlets, which typically are not air tight. The front face of the PDU may include a lip that extends inwardly over a portion of the recessed surface and is adapted to engage with a plug retention tab that extends from an arm of a plug that may be coupled with an outlet. Such an assembly allows a power distribution unit to be placed in an equipment rack and coupled with an input power source, and with equipment located in the rack in a flexible and convenient manner. Clearances and dimensions of equipment racks may be modified to provide enhanced space usage, efficiency, and/or density in a facility.

In some aspects, one or more of the outlet banks in a PDU may include a plurality of outlets that are coupled with a flexible cord and extend away from a front face of the PDU. The flexible cord coupled with each outlet may penetrate a recessed surface relative to the front face of the PDU. The flexible cord may be coupled with a power source in an interior portion of the PDU housing. The interior portion of the PDU housing may include space to receive a portion of the flexible cord thereby providing the ability to extend an associated outlet away from the front face of the PDU housing, and retract an outlet toward the front face of the PDU housing. Such an assembly allows a power distribution unit to be placed in an equipment rack and coupled with an input power source, and with equipment located in the rack in a flexible and convenient manner. Having a flexible cord extending from a PDU gives the ability to uniformly space the outlets along the length of the PDU which is desirable in that all the interconnecting cords coming from the computing equipment can be of equal length. Clearances and dimensions of equipment racks may be modified to provide enhanced space usage, efficiency, and/or density in a facility.

In further aspects, one or more of the outlet banks in a PDU may include a plurality of outlets that are rotatably coupled relative to a PDU housing. The outlet banks may include an outlet shaft housing that receives a cord coupled with each outlet and provides for rotation of the outlet relative to the PDU housing. An outlet enclosure housing is coupled with the outlet shaft housing and couples the respective outlet bank with the PDU housing. The cord associated with each outlet may be coupled with a power source in an interior portion of the PDU housing. The interior portion of the PDU housing may include space to receive a portion of the cord, thereby providing the ability to extend an associated outlet away from the outlet enclosure housing and retract an outlet toward the outlet enclosure housing, in addition to providing the ability to rotate the outlet relative to the outlet enclosure housing. Such an assembly allows a power distribution unit to be placed in an equipment rack and coupled with an input power source, and with equipment located in the rack in a flexible and convenient manner. Such an assembly lends itself to a compact design, that is modularly constructed, allowing rapid and highly variable configurations to be realized. Clearances and dimensions of equipment racks may be modified to provide enhanced space usage, efficiency, and/or density in a facility.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the spirit and scope of the appended claims. Features which are believed to be characteristic of the concepts disclosed herein, both as to their organization and method of operation, together with associated advantages will be better understood from the following description when considered in connection with the accompanying figures. Each of the figures is provided for the purpose of illustration and description only, and not as a definition of the limits of the claims.

BRIEF DESCRIPTION OF THE DRAWINGS

A further understanding of the nature and advantages of the present invention may be realized by reference to the following drawings. In the appended figures, similar components or features may have the same reference label.

FIG. 16 is a perspective view of the outlet connector end cap shown in FIGS. 10-14;

FIG. 17 is a front view in elevation of the end cap shown in FIG. 16;

FIG. 18 is a top plan view of the end cap shown in FIGS. 16 and 17;

FIG. 19 is a bottom plan view of the end cap shown in FIGS. 16-18;

FIG. 20 is a side view in elevation of the end cap shown in FIGS. 16-19;

FIG. 21 is a side view in elevation of the end cap shown in FIGS. 16-20;

FIG. 22 is a perspective view of an outlet connector bank according to a representative embodiment;

DETAILED DESCRIPTION

This description provides examples, and is not intended to limit the scope, applicability or configuration of the invention. Rather, the ensuing description will provide those skilled in the art with an enabling description for implementing embodiments of the invention. Various changes may be made in the function and arrangement of elements.

Thus, various embodiments may omit, substitute, or add various procedures or components as appropriate. For instance, aspects and elements described with respect to certain embodiments may be combined in various other embodiments. It should also be appreciated that the following systems, devices, and components may individually or collectively be components of a larger system, wherein other procedures may take precedence over or otherwise modify their application.

The following patents and patent applications are incorporated herein by reference in their entirety: U.S. Pat. No. 7,043,543, entitled "Vertical-Mount Electrical Power Distribution Plugstrip," issued on May 9, 2006; U.S. Pat. No. 7,990,689, entitled "Power Distribution Unit And Methods Of Making And Use Including Modular Construction And Assemblies," issued on Aug. 2, 2011; U.S. Pat. No. 8,494, 661, entitled "Power Distribution, Management, and Monitoring Systems," and issued on Jul. 23, 2013; U.S. Pat. No. 8,321,163, entitled "Monitoring Power-Related Parameters in a Power Distribution Unit," and issued on Nov. 27, 2012; and U.S. Pat. No. 8,587,950, entitled "Method and Apparatus for Multiple Input Power Distribution to Adjacent Outputs," and issued on Nov. 19, 2013.

Apparatuses and devices are provided that allow for efficient and flexible distribution of power to equipment located, for example, in an electrical equipment rack. Traditionally, PDUs have outlets that include an outer jacket around an outlet core. Aspects of the disclosure provide outlets in a power distribution unit that have such an outer jacket removed. By removing the outer jacket, such as typically included with a C13 or C19 receptacle for example, the core element of the power receptacle remains and allows reduced possible spacing of receptacles, thus allowing for maximization of receptacle density. Such core receptacles can be mounted on a PCB, sheet metal, molded into a multi receptacle (ganged) module, or mounted at the end of a flexible cord, according to various embodiments, providing flexibility in the configuration and manufacturing of such PDUs.

Figure 1:
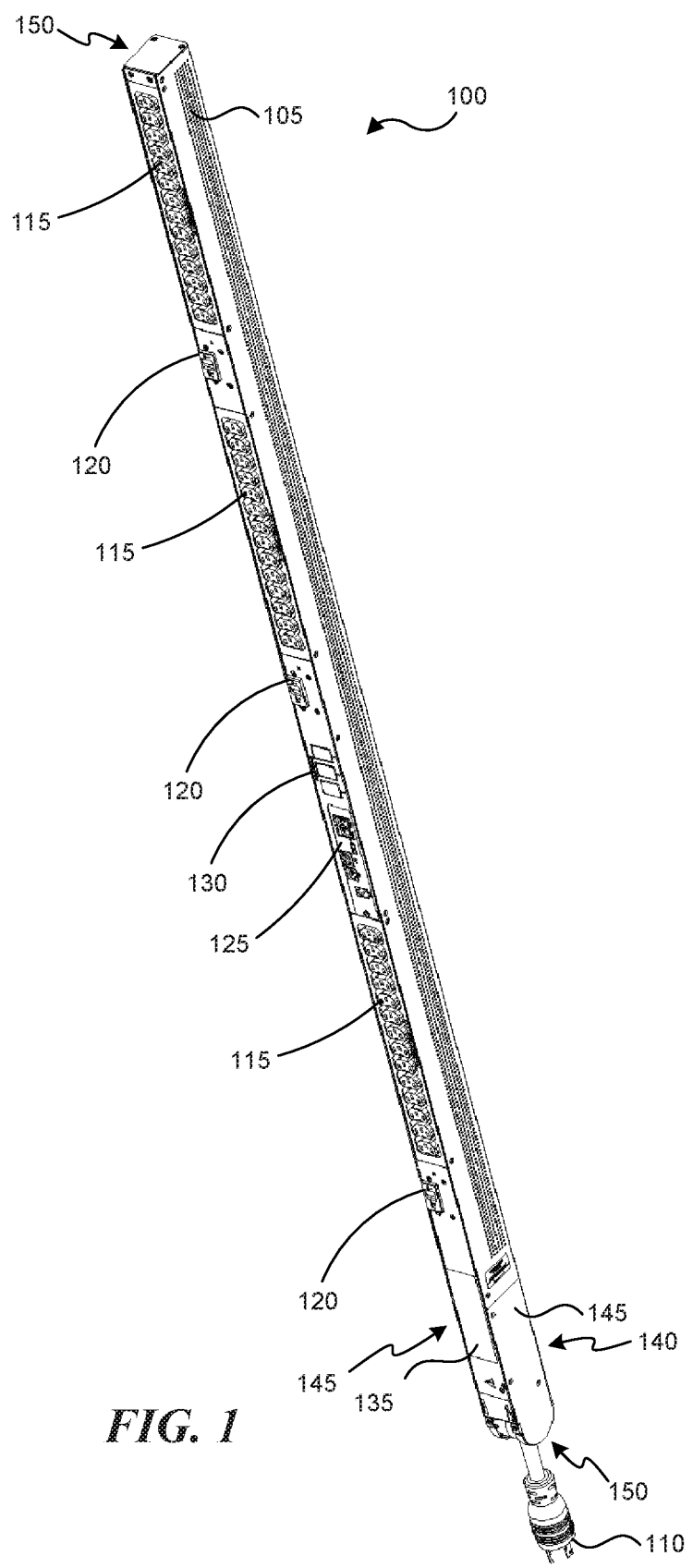
FIG. 1 is an illustration of a power distribution unit in accordance with various embodiments.

FIG. 1 is an illustration of a PDU 100 of an embodiment that includes various features of the present disclosure. The PDU 100 includes a PDU housing 105 and a power input 110 that penetrates the housing 105 and may be connected to an external power source. Though not by way of limitation, the power input of this embodiment is a swivel input cord assembly, such as described in patent application Ser. No. 61/675,921, filed on Jul. 26, 2012, and incorporated by reference herein in its entirety. The PDU 100 according to this embodiment includes housing 105 that is vertically mountable in an equipment rack, although it will be understood that other form factors may be used, such as a horizontally mountable housing. A plurality of outlet banks 115 are located within the housing 105 and are accessible through apertures in a front face of the housing 105. The outlet banks 115 will be described in more detail below. The PDU 100 of FIG. 1 includes a number of circuit breakers 120 that provide over-current protection for one or more associated outlet banks 115. The PDU 100 also includes a communications module 125 that may be coupleable with one or more of a local computer, local computer network, and/or remote computer network. A display portion 130 may be used to provide a local display of information related to current operating parameters of the PDU 100, such as the quantity of current being provided through the input and/or one or more of the outlets.

Figure 2:
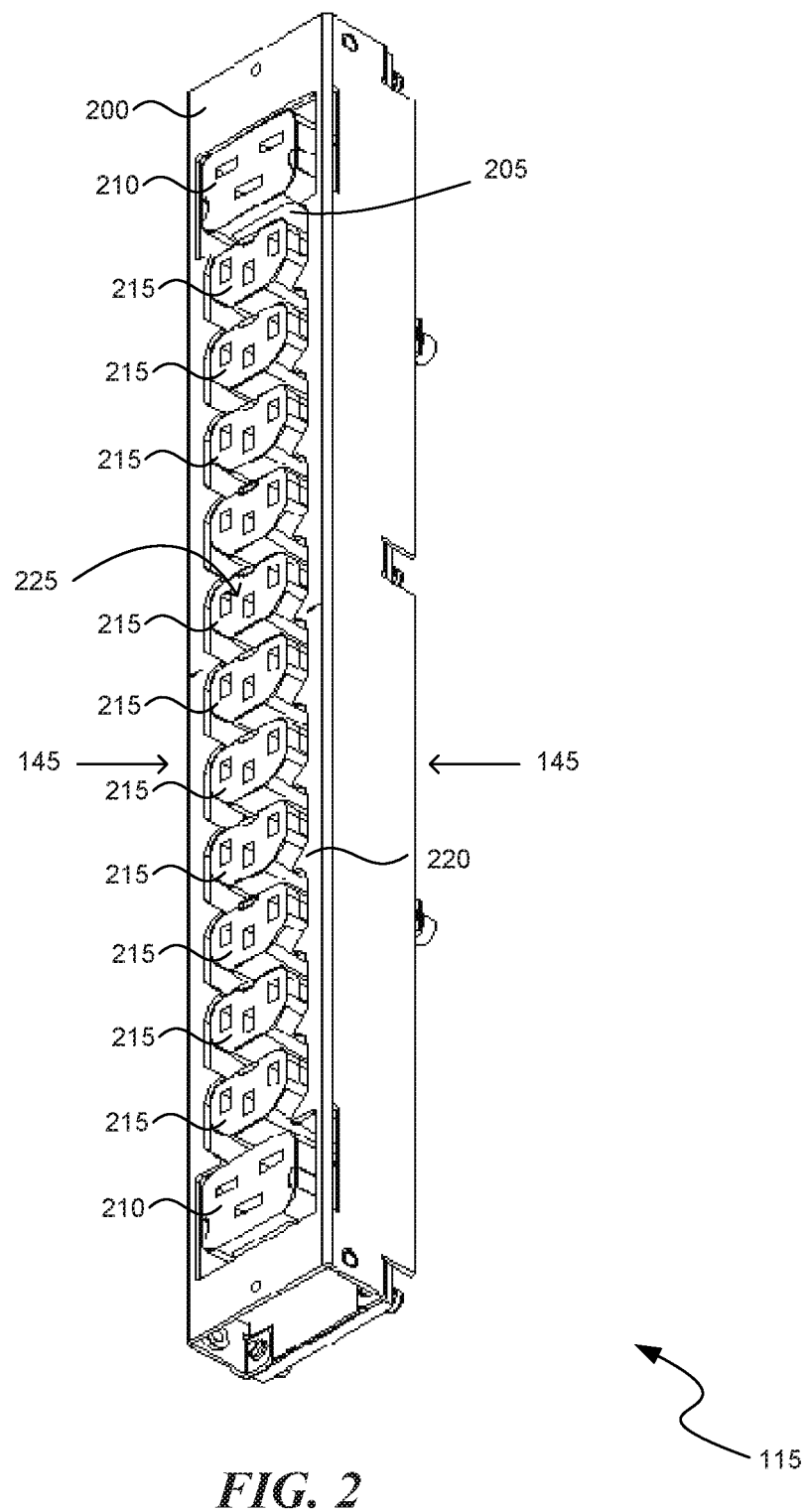
FIG. 2 illustrates an outlet bank of some embodiments.

With reference now to FIG. 2, an outlet bank 115 of an embodiment is discussed. The outlet bank 115 is accessible through an aperture in the front face 200 of the PDU housing 105. The outlet bank 115 includes a recessed surface 205 that is located in an interior portion of housing 105, and has a number of power outlets coupled thereto. In this embodiment, two C19 type connectors 210, and eight C13 type connectors 215 are provided in the outlet bank 115. The plurality of outlets 210 and 215 include an outlet core only, without an associated outer jacket. The outlet bank 115, according to some embodiments, may be a portion of an intelligent power module that supplies power to assets that may be mounted into an equipment rack. Such equipment racks are well known, and often include several individual assets that are used in operation of a data center. As is well known, numerous equipment racks may be included in a data center, and in various embodiments each asset in each equipment rack may be monitored for power usage through one or more associated intelligent power modules. The recessed surface 205, in some embodiments, includes a surface of a printed circuit board to which the power outlets are mounted. The recessed surface 205 may, in some embodiments, form a tray for mounting the outlets that seals an internal portion of the housing 105 to provide a substantially air tight internal portion. For example, the power outlets may be mounted to a printed circuit board that is used to form a seal between an exterior of the housing 105 and components internal to the housing 105. Such a seal may be provided, for example, through a frictional fit between a printed circuit board and internal surfaces of the sides 145 of the housing 105, through a sealant, and/or through a gasket that provides a seal between the housing and a printed circuit board. The internal portion of the housing 105 may include, for example, power measurement and distribution components, and may be actively cooled.

It will be understood that this embodiment, and other embodiments described herein as having noted IEC type outlets, are exemplary only and that any of various other types of outlets alternatively can be used. For example, the "outlets" can be NEMA type outlets (e.g., NEMA 5-15R, NEMA 6-20R, NEMA 6-30R or NEMA 6-50R) or any of various IEC types (e.g., IEC C13 or IEC C19). It also will be understood that all "outlets" in a particular power outlet bank 115, or other module-outlet described herein, need not be identical or oriented uniformly along the PDU. It also will be understood that the "outlets" are not limited to three-prong receptacles; alternatively, one or more of the "outlets" can be configured for two or more than three prongs in the mating male connector. It also will be understood that the "outlets" are not limited to having female prong receptacles. In any "outlet," one or more of the "prong receptacles" can be male instead of female connection elements, as conditions or needs indicate. In general, as used herein, female and male "prong receptacles" are termed "power-connection elements". While outlet bank 115 of this embodiment includes ten outlets, it will be understood that this is but one example and that an outlet bank may include a different number of outlets.

The power outlets 210 and 215 may extend from the recessed surface 205 by various relative or absolute distances. For example, an outward or distal face 225 of the outlets 210 and 215 can be manufactured to extend or terminate 0.5 inches, 1 inch, 1.5 inches, or another predetermined absolute distance from the recessed surface 205. As another example, the outward or distal face 225 of the outlets 210 and 215 can be manufactured to extend or terminate at a predetermined relative distance from the recessed surface 205, in relation to a plane of the front face 200 of the PDU housing 105. The relative distance of extension or termination of the distal face 225 of the outlets can include, according to various embodiments: proximate to and below a plane of the front face 200, proximate to and above a plane of the front face 200, in line with a plane of the front face 200, substantially below a plane of the front face 200, and substantially above a plane of the front face 200.

With particular reference to FIG. 1, the PDU housing 105 for an outlet module may be any suitable housing for such a device, as is known to one of skill in the art, and may be assembled with other modules in a PDU. Such a housing generally includes a front portion 135 and a rear portion 140. The front portion 135 is substantially planar, and the rear portion 140 is substantially planar and parallel to the front portion 135. The housing 105 also includes longitudinally extending side portions 145 and transverse end portions 150. The front portion 135, rear portion 140, side portions 145, and end portions 150 are generally orthogonal to each other in a generally rectangular or box-type configuration. The housing 105 can be made of any suitable, typically rigid, material, including, for example, a rigid polymeric ("plastic") material. In at least certain embodiments, the front and rear portions are made from an electrically insulative material, whereas in other embodiments conducting materials are used for safe ground bonding. The side portions and the end portions may be integrally formed, optionally along with the front portion or the rear portion. Each outlet 210-215 is interconnected to the power source through any of a number of well-known connection schemes, such as spade, lug, plug connectors, screw connectors, or other suitable type of connector. Furthermore, if desired, one or more of these electrical connectors can be located inside the housing or outside the housing, in embodiments where the power outlet module includes a housing.

Figure 3:
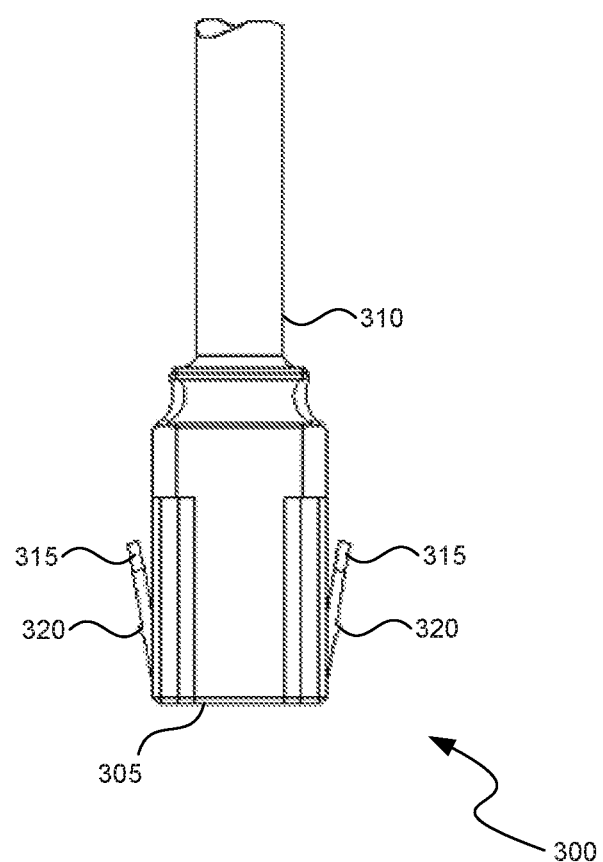
FIG. 3 illustrates a locking plug of according to various embodiments.
Figure 4:
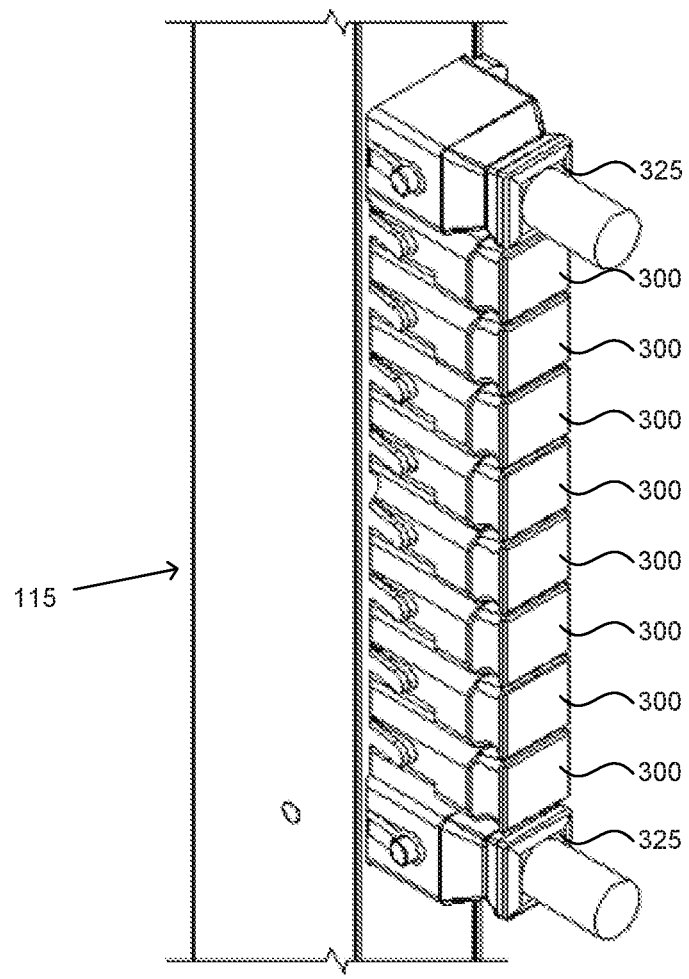
FIG. 4 illustrates an outlet bank and associated locking plugs coupled with the outlet bank according to various embodiments.

In some embodiments, the apertures in the housing 105 include a lip 220 around at least a portion of each aperture. The lip 220 extends over a portion of the recessed surface 205 and may engage with a plug retention tab that extends from an arm of a plug that may be coupled with an outlet. In such a manner, plugs may be retainably engaged (or locked) with the PDU 100, and inadvertent disconnections of associated equipment may be avoided. FIG. 3 illustrates a plug 300 that may be used to lock a power cord into an outlet bank 115. The plug 300 includes a plug body 305, and a flexible cord 310 that extends from the plug body 305. Arms 315 extend from the sides of the plug body 305 and each include a plug retention tab 320 that will engage with the lip 220 when the plug 305 is inserted into the outlet bank 115. When it is desired to unplug the plug 300, a user may squeeze the arms 315 toward the plug body 305 and remove the plug 300. FIG. 4 illustrates an outlet bank 115 with plugs 300 coupled with the outlets 215. In this embodiment, plugs 325 are provided with similar arms and retention tabs and coupled with outlets 210. In this particular example, cords for the C13 outlets are not included in the illustration, and are shown partially for the C19 outlets, for purposes of providing a more clear illustration.

Figure 5:
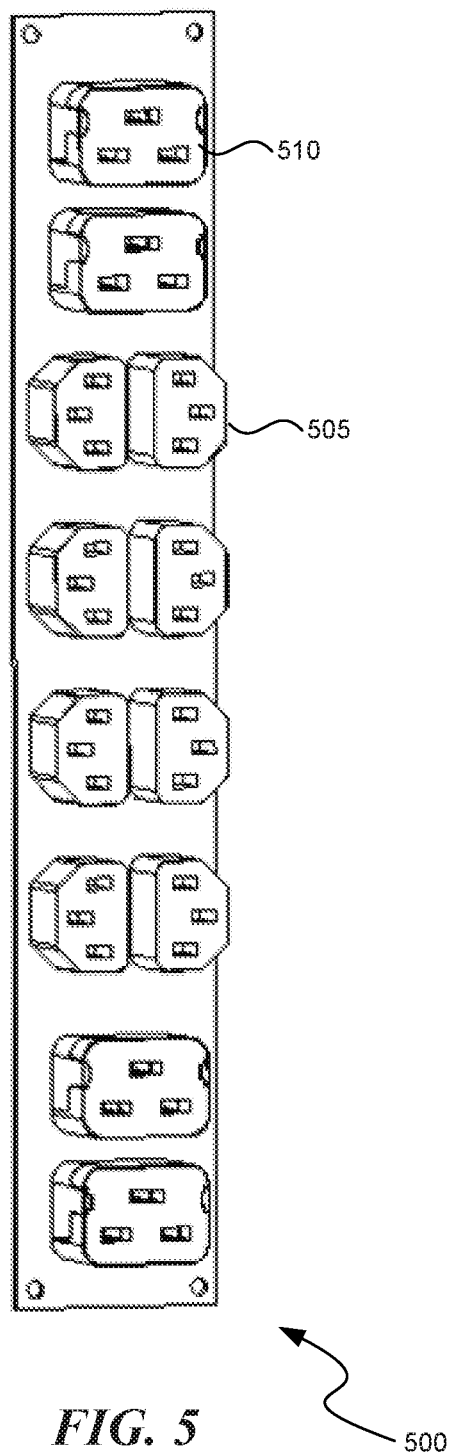
FIG. 5 illustrates an outlet bank of another embodiment.

As mentioned above, a PDU may have numerous different arrangements and numbers of outlets. FIG. 5 illustrates an exemplary alternate arrangement of outlets in outlet bank 500. In this particular example, eight C13 outlets 505 are provided, along with four C19 outlets 510. Such an arrangement may provide a relatively high density of power outlets as compared to traditional PDUs, thereby providing enhanced efficiency and space usage in many applications in which a relatively high number of computing equipment components may be present in an equipment rack, for example.

Figure 6:
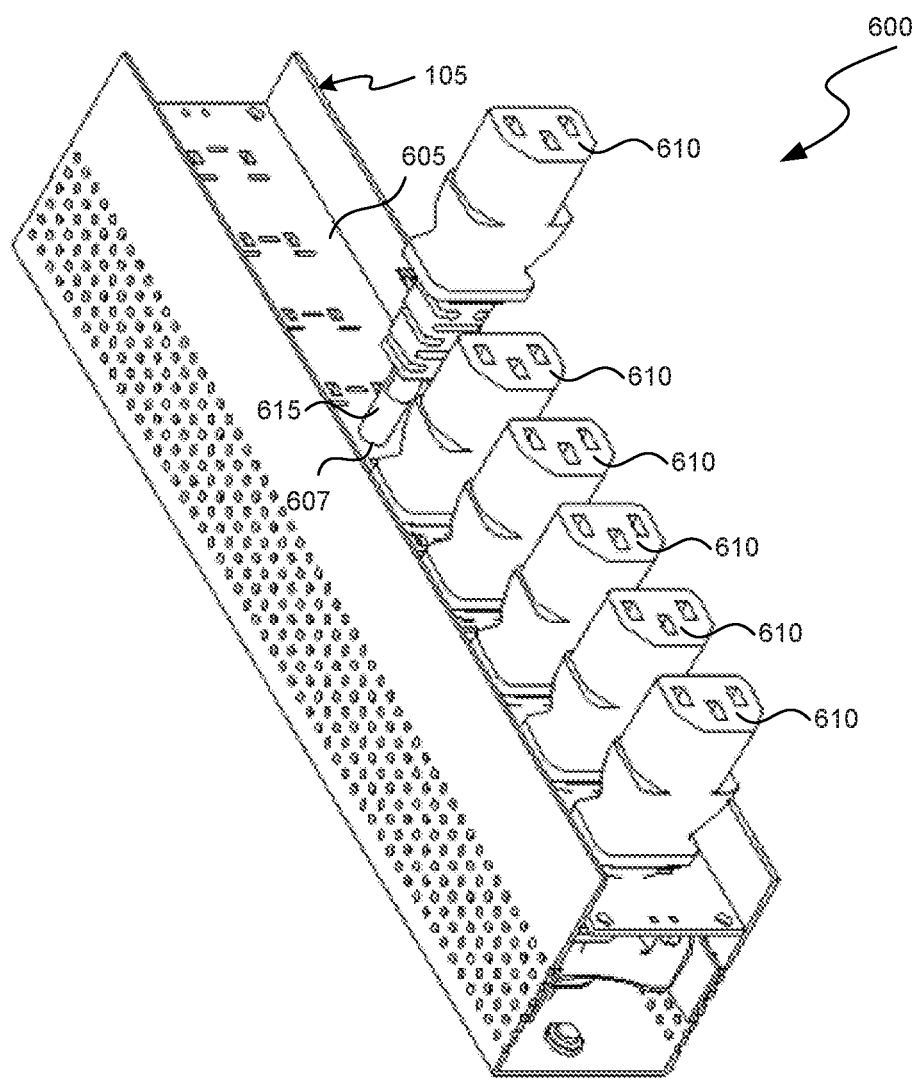
FIG. 6 illustrates an outlet bank with retractable outlet assemblies according to various embodiments.

In some embodiments, such as illustrated in FIG. 6, an outlet bank 600 may include a recessed surface 605 from which a number of power outlets 610 may extend that are coupled with a length of flexible insulated cord 615. In the embodiment of FIG. 6, the outlets 610 extend through an associated aperture 607 in housing 105 and may provide a connection that is movable to some degree relative to the PDU housing 105. Thus, a user may be provided with additional flexibility in making connections with the outlet bank 600 of such a PDU. The flexible cord 615 penetrates the recessed surface 605 and is coupled with a power source in an interior of the housing 105. The interior portion of the housing 105, in such embodiments, may include a cavity to receive a portion of the flexible cord 615, such that the outlets 610 are extendable away from the front face of the housing 105, and retractable toward the front face of the housing 105. In some embodiments, a user may simply push a cord into the housing 105 to retract the cord, or pull a cord away from the housing 105 to extend the cord. Excess cord may be stored within the cavity of the housing 105 by simply allowing the cord to bunch up within the cavity, or a retraction/extension mechanism such as a spool or cylinder may be provided in the cavity that may receive the cord. Similarly as discussed above, a PDU may have numerous different arrangements and numbers of outlets, and FIG. 6 illustrates one of numerous different available arrangements of outlets in such an outlet bank 600. Such arrangements may provide a relatively high density of power outlets as compared to traditional PDUs, thereby providing enhanced efficiency and space usage in many applications in which a relatively high number of computing equipment components may be present in an equipment rack, for example. In some embodiments, PDUs including outlet cores such as described herein may provide significant reductions in the area required for each outlet, with some embodiments providing approximately a 40% reduction in area required for C13 outlets and approximately a 30% reduction in area required for C19 outlets.

Figure 7:
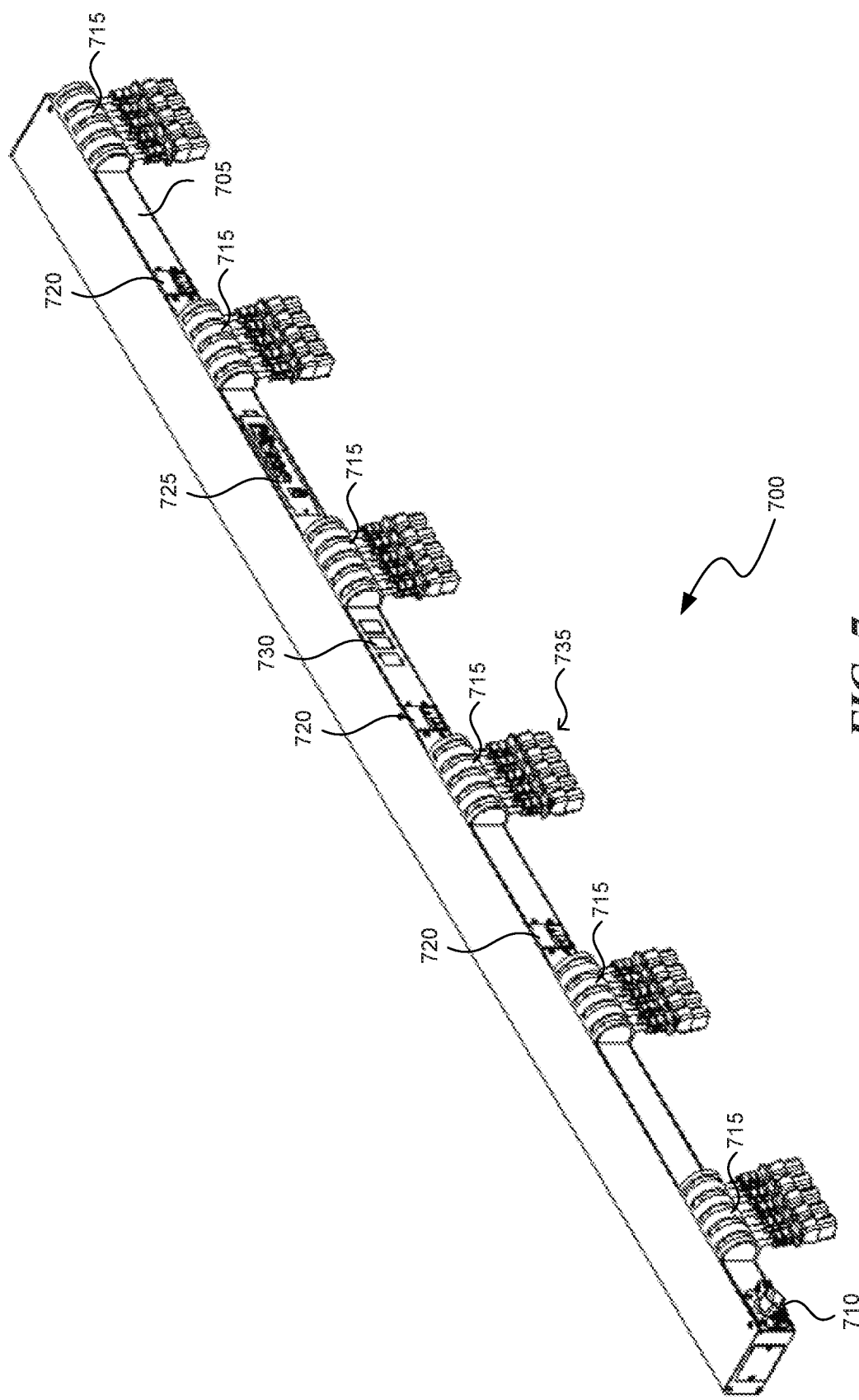
FIG. 7 illustrates a power distribution unit with rotatable outlets in accordance with various embodiments.
Figure 8:
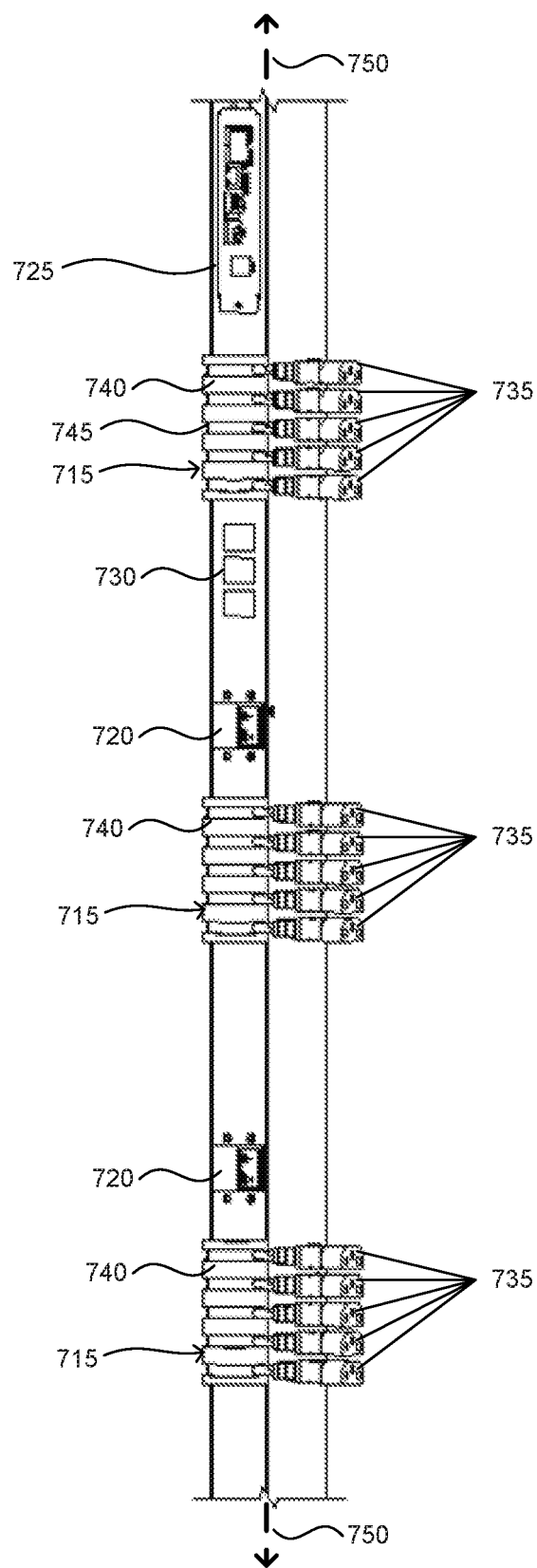
FIG. 8 illustrates a portion of the PDU depicted in FIG. 7.
Figure 9:
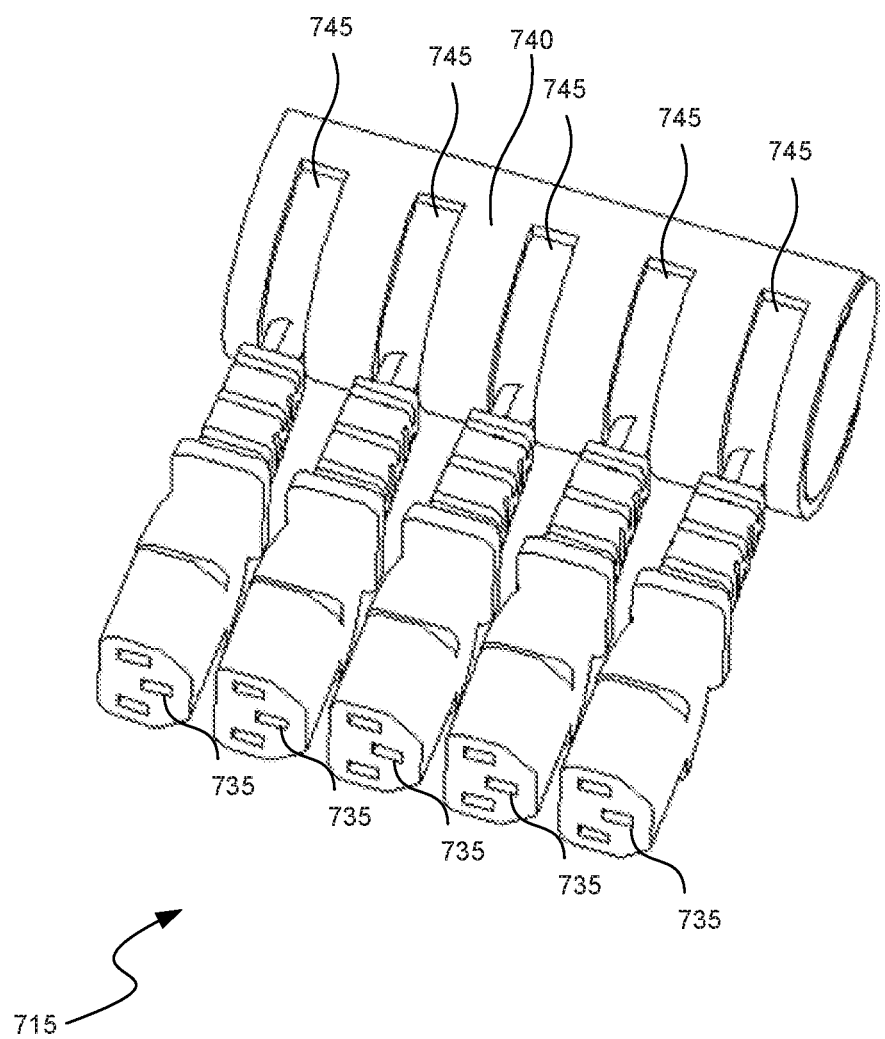
FIG. 9 illustrates an outlet bank assembly with rotatable outlets according to various embodiments.

With reference now to FIGS. 7-9, a PDU 700 according to various other embodiments is illustrated. The PDU 700, includes a PDU housing 705 and a power input 710 that penetrates the housing 705 and may be connected to an external power source. The power input 710 of this embodiment is a fixed position power input, although a swivel input cord assembly, such as illustrated in FIG. 1, may be used according to various embodiments. The PDU 700, according to this embodiment, includes housing 705 that is vertically mountable in an equipment rack, although it will be understood that other form factors may be used, such as a horizontally mountable housing. A plurality of outlet banks 715 are coupled with the housing 705 and include a plurality of rotatable outlets 735 that extend away from the housing 705. The outlet banks 715 are illustrated in additional detail in FIGS. 8-9. The PDU 700 of FIG. 7 includes a number of circuit breakers 720 that provide over-current protection for one or more associated outlet banks 715. The PDU 700 also includes a communications module 725 that may be coupleable with one or more of a local computer, local computer network, and/or remote computer network. A display portion 730 may be used to provide a local display of information related to current operating parameters of the PDU 700, such as the quantity of current being provided through the input and/or one or more of the outlets.

With reference now to FIGS. 8-9, an outlet bank 715 of an embodiment is discussed in more detail. In this embodiment, the outlet bank 715 includes a number of rotatable outlets 735 that are coupled with an outlet enclosure housing 740 and outlet shaft housing 745 within the outlet enclosure housing 740. The outlet shaft housing 745 receives a cord coupled with each outlet 735 and provides for rotation of the outlet 735 around or relative to a longitudinal axis 750 of the PDU housing 705. Each outlet 735 is secured to the outlet shaft housing 745, which may rotate relative to the outlet enclosure housing 740. In some embodiments, the outlet shaft housing 745 includes a cavity to receive a portion of the cord from each outlet 735, providing the ability to extend or retract outlets 735 relative to the outlet shaft housing 745. The exit point of the cord from the outlet shaft housing 745 may be oriented such that it limits, reduces, or minimizes the movement of the conductors within outlet shaft housing 745 and the associated connection between the conductors and a power source connection within housing 705. Additionally, the outlet shaft housing 745 may provide strain relief for the cord. In some embodiments, each of the rotatable outlets 735 are coupled with the PDU housing 705 in a manner similar as the rotatable assembly described in U.S. Patent Application No. 61/675,921, filed on Jul. 26, 2012, entitled "Multi-Position Input Cord Assembly for a Power Distribution Unit," the entire disclosure of which is incorporated herein by reference.

In the embodiments of FIGS. 7-9, outlets 735 are illustrated as IEC-type outlets, although it will be readily understood that any of various other types of outlets alternatively can be used. For example, the "outlets" can be NEMA type outlets (e.g., NEMA 5-15R, NEMA 6-20R, NEMA 6-30R or NEMA 6-50R) or any of various IEC types (e.g., IEC C13 or IEC C19). It also will be understood that all "outlets" in a particular power outlet bank 115, or other module-outlet described herein, need not be identical or oriented uniformly along the PDU.

Figure 10:
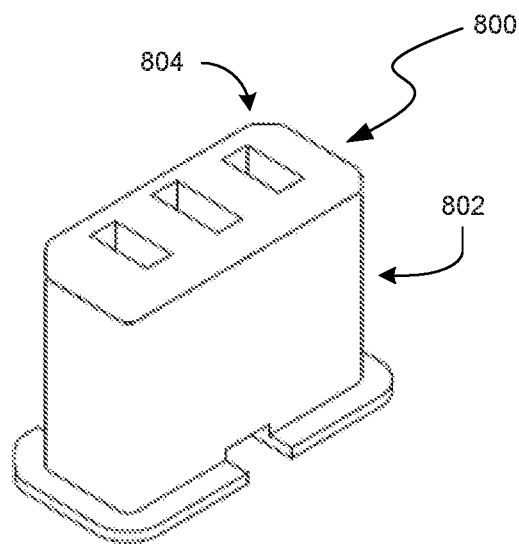
FIG. 10 is a perspective view illustrating an outlet connector according to a representative embodiment.
Figure 11:
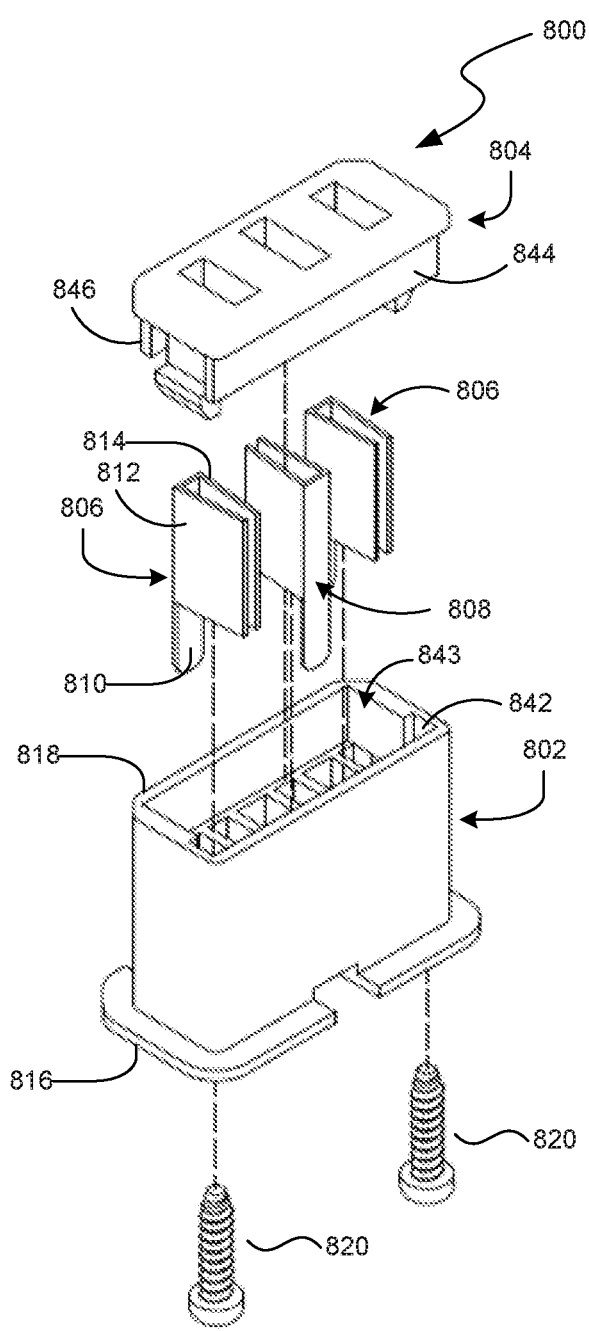
FIG. 11 is an exploded perspective view illustrating the outlet shown in FIG. 10.

Outlet connector 800 shown in FIG. 10 includes an outlet core 802 and an end cap 804 connected to the outlet core. With further reference to FIG. 11, outlet connector 800 includes a plurality of electrical terminals 806 and 808. Electrical terminals 806 and 808 are positioned between the outlet core 802 and the end cap 804. Connector 800 includes two outer electrical terminals 806 and a middle electrical terminal 808. In some embodiments, electrical terminals 806 and 808 have the same construction although middle terminal 808 is positioned to face the opposite direction of electrical terminals 806. Thus, although the electrical terminals are aligned with respect to each other, the middle connection tab is offset from the outer electrical terminal's connection tabs. In other embodiments, the terminals may be different sizes. For example, in this embodiment middle terminal 808 is larger than the outer terminals 806.

In some embodiments, electrical terminals 806 and 808 are constructed from suitable electrically conductive materials such as tin, copper, gold, silver, and the like. Multiple materials can be used in combination. For example, the terminals can be constructed of tin with a suitable coating material. In one embodiment, the terminals comprise copper with a tin plating. In some embodiments, the terminals such as outer terminals 806 are formed from a single piece of conductive material by bending contacts 812 and 814 away from connection tab 810. Although the electrical terminals are aligned with respect to each other, the middle connection tab is offset from the outer electrical terminals' connection tabs. Contacts 812 and 814 are bent inward towards each other such that when a mating contact (not shown) is inserted into the electrical terminal, the contacts 812 and 814 are urged toward the mating terminal. Accordingly, in some embodiments it is desirable to form the electrical terminals 806 and 808 from a conductive resilient spring-like material. Connection tabs 810 extend through and beyond the input side 816 of the connector core 802. Accordingly, contacts 812 and 814 are positioned toward the output side 818 of the outlet core 802. It can be appreciated from the figure that electrical terminals 806 and 808 are configured as female receptacles. In other embodiments the electrical terminals 806 and 808 may be configured as male terminals or a combination of male and female terminals.

As shown in FIG. 11, end cap 804 is insertable into cavity 843 formed in outlet core 802. Internal indexing features 846 and 844 help ensure that end cap 804 is inserted into cavity 843 in the correct orientation. Features 844 and 846 act in cooperation with indexing relief feature 842 formed into the side of cavity 843. In some embodiments, the outlet connector 800 is mountable to a printed circuit board or other surface with mounting screws 820.

Figure 12:
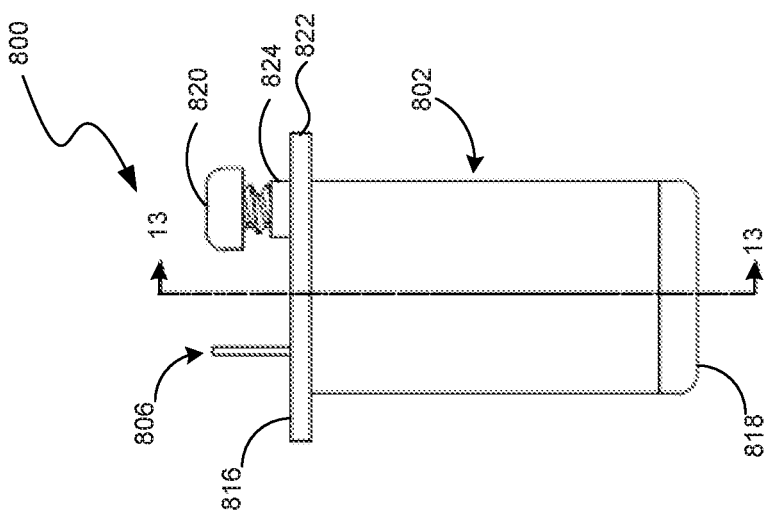
FIG. 12 is a side view in elevation of the outlet connector shown in FIGS. 10 and 11.
Figure 13:
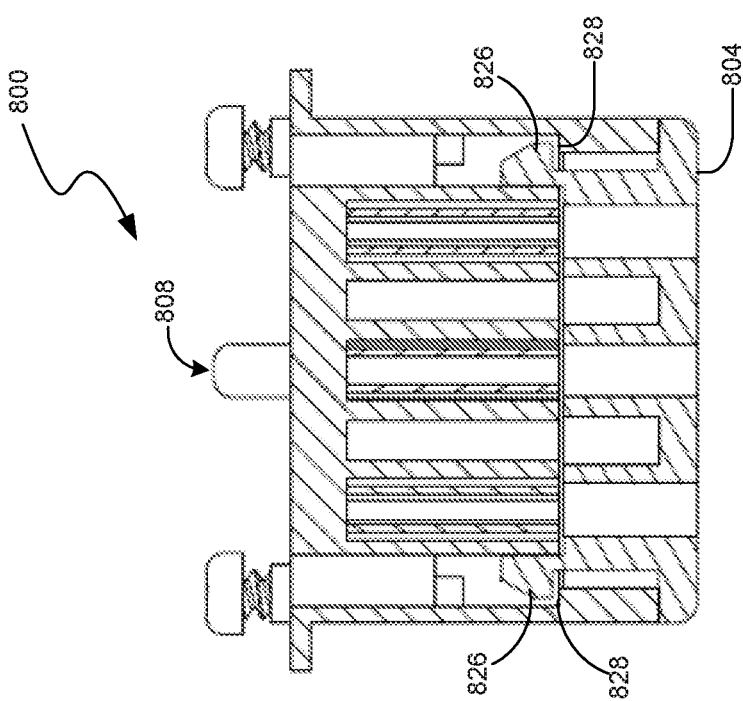
FIG. 13 is a front view in cross-section of the outlet connector taken about line 13-13 in FIG. 12.

As shown in FIG. 12, mounting screws 820 are each screwed into a boss 824 which protrudes from mounting flange 822. Mounting flange 822 is adjacent the input side 816 of the outlet core 802 and provides stabilization of the connector 800 against its mounting surface. Mounting boss 824 extends from flange 822 to help position and locate the outlet connector 800 on its mounting surface such as a printed circuit board. As shown in FIG. 13, end cap 804 includes a pair of latches 826 that engage ledges 828 formed in outlet core 802. Accordingly, latches 826 help prevent end cap 804 from being removed from the outlet core 802.

Figure 14:
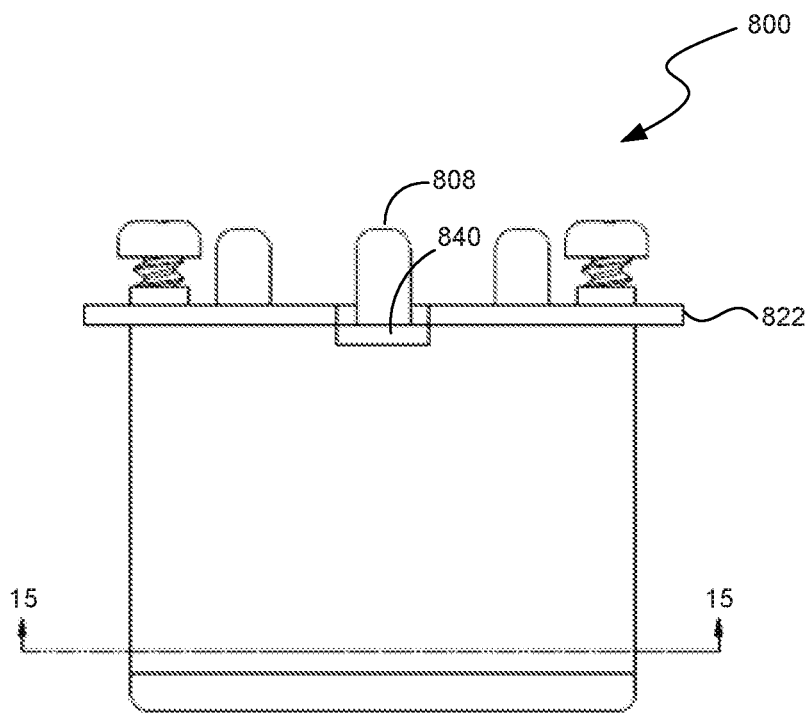
FIG. 14 is a front view in elevation of the outlet connector shown in FIGS. 10-13.
Figure 15:
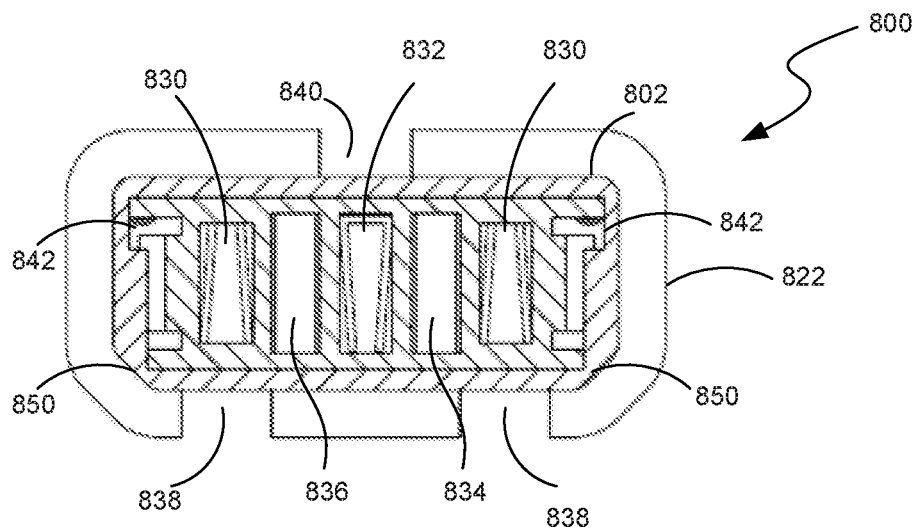
FIG. 15 is a top view in cross-section of the outlet connector taken about line 15-15 in FIG. 14.

As shown in FIGS. 14 and 15, mounting flange 822 includes notches 838 and 840 positioned adjacent corresponding terminals. Notches 838 and 840 allow for visible inspection of terminal solder joints and also allow flux residue to be removed. Referring to FIG. 15, outlet core 802 includes a plurality of aligned apertures 830 and 832. In some embodiments, cavities 834 and 836 are interposed between the outer apertures 830 and the middle aperture 832. As shown in the figure, the electrical terminals are positioned within the apertures. Outlet core 802 also includes external indexing features 850. In this embodiment, the external indexing features 850 are in the form of chamfers.

As shown in FIGS. 16-21, end cap 804 includes a body portion 860 insertable into the cavity 843 of outlet core 802 (see FIG. 11) and a flange 862. End cap 804 includes a plurality of apertures 854 and 856 extending through the cap. Outer apertures 854 correspond to the outer apertures 830 of outlet core 802 (see FIG. 15). Similarly, middle aperture 856 corresponds to the middle aperture 832 of outlet core 802 (see FIG. 15). End cap 804 also includes a pair of indexing features 852 which correspond to the indexing features 850 of the outlet core 802 (see FIG. 15). Latches 826, as shown in FIG. 17, include ramped surfaces 864 and a latch surface 866. As shown in FIG. 19, end cap 804 includes cavities 858 interposed between the outer apertures 854 and middle aperture 856. As mentioned above, end cap 804 includes internal indexing features 844 and 846. As shown in the figure, indexing features 844 extend beyond body portion 860 further than indexing feature 846. Indexing feature 844 corresponds to the indexing cutout 842 of the core 802 (see FIG. 15).

In some embodiments, the end cap 804 can be color coded to indicate an output capacity (e.g., amperage) or phase configuration of the associated outlet core. In some embodiments, the end cap 804 has a contrasting color with respect to the outlet core. In some embodiments, the end cap 804 is a different color than the outlet core. The disclosed technology can be used with any suitable phase configuration such as single, dual, and/or three phase configurations, including polyphase connections described in U.S. Pat. No. 8,541,906, the disclosure of which is incorporated herein by reference in its entirety.

Outlet connector bank 900, as shown in FIG. 22, includes a unitary body 902 having a surrounding sidewall 903 with a flange 904 extending therefrom. The unitary body 902 includes a plurality of outlet cores 906 and an unobstructed space 910 between adjacent pairs of the plurality of outlet cores 906. As with the outlet connectors described above, each outlet core includes at least three aligned apertures. The plurality of electrical terminals are positioned each in a corresponding one of the plurality of aligned apertures. Each outlet core includes an end cap 908 connected to and surrounding the electrical terminals of the outlet cores 906. Surrounding sidewall 903 includes a plurality of latches 912 to facilitate retaining the outlet bank in a corresponding chassis. The sidewall also includes slots 905 to receive the retainers of a mating plug, such as the retention arms and tabs (315, 320) described above with respect to FIG. 3. The retainers of mating plugs positioned adjacent latches 912 can engage openings 913.

Figure 25:
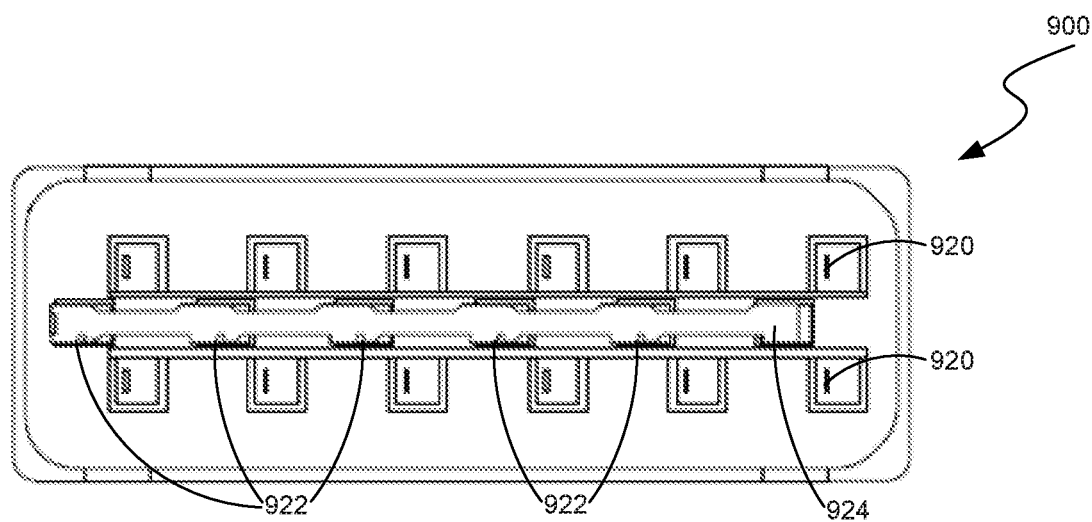
FIG. 25 is a bottom plan view of the outlet connector bank shown in FIGS. 23 and 24.
Figure 24:
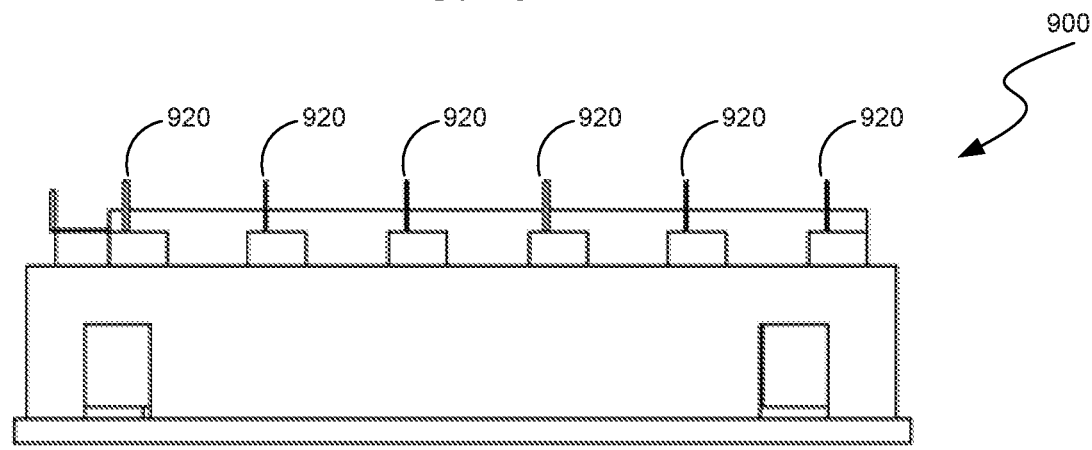
FIG. 24 is a side view in elevation of the outlet connector bank shown in FIG. 23.
Figure 23:
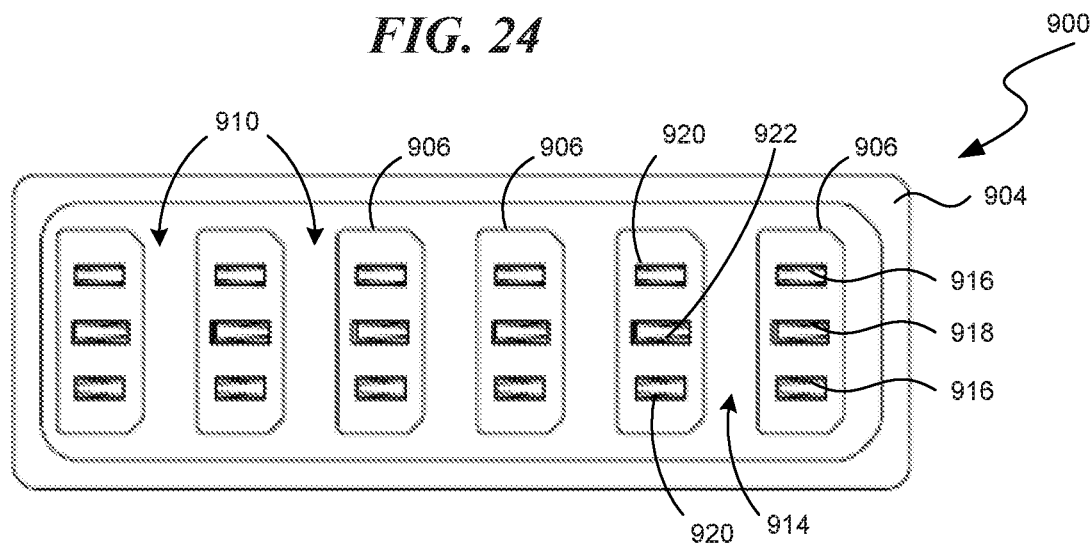
FIG. 23 is a top plan view of an outlet connector bank according to another representative embodiment.
Figure 28:
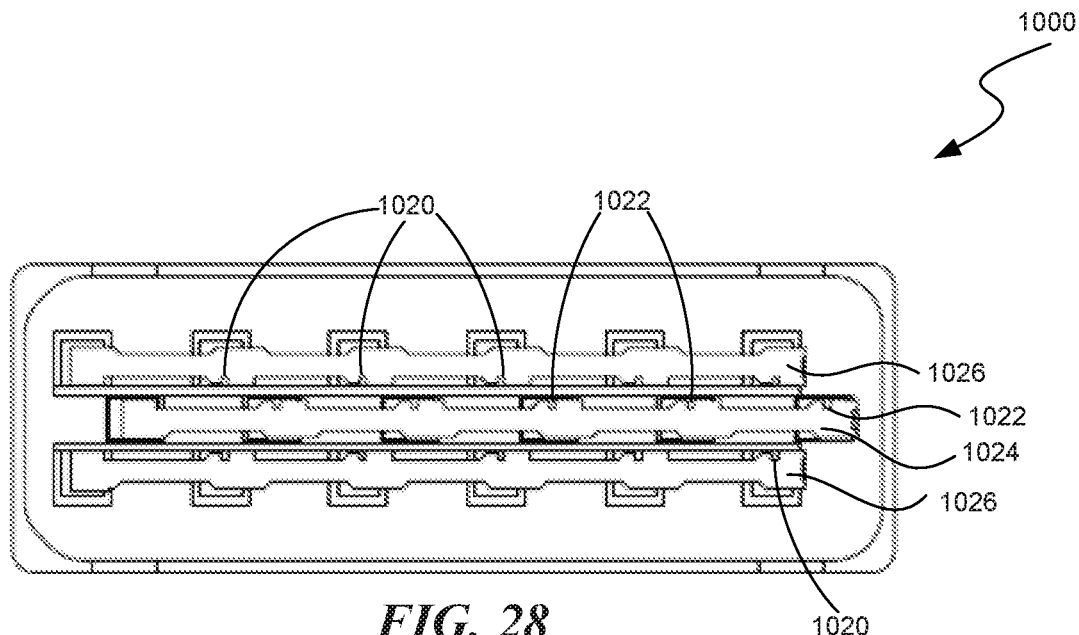
FIG. 28 is a bottom plan view of the outlet connector bank shown in FIGS. 26 and 27.
Figure 27:
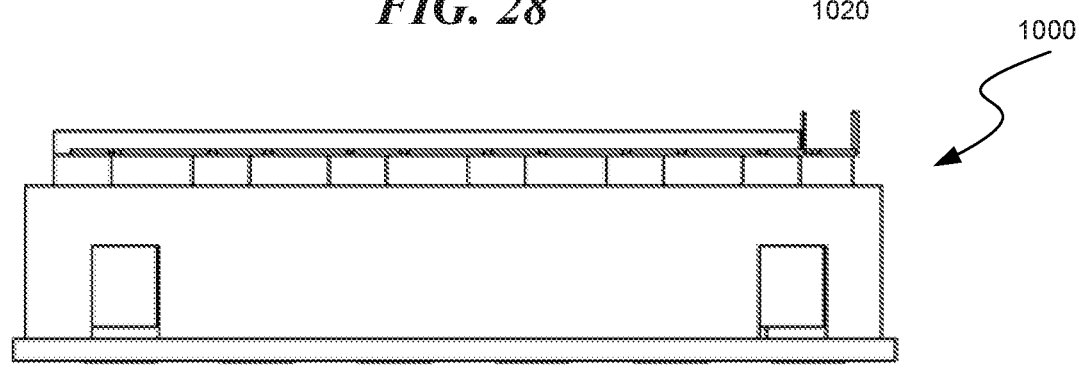
FIG. 27 is a side view in elevation of the outlet connector bank shown in FIG. 26.
Figure 26:
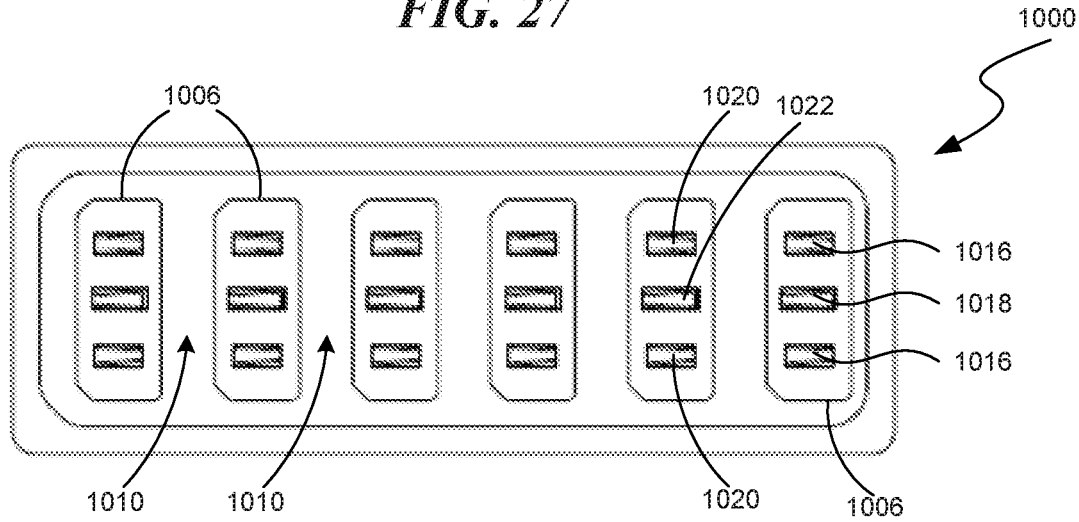
FIG. 26 is a top plan view of an outlet connector bank according to a further representative embodiment.

As shown in FIG. 23, outlet connector bank 900 includes a recessed surface 914 which is part of unitary body 902 from which the plurality of outlet cores 906 extend toward the surrounding flange 904. Each outlet core 906 includes the plurality of aligned apertures 916 and 918. The apertures include outboard apertures 916 and middle aperture 918. Electrical terminals 920 are positioned in the outboard apertures 916 while middle terminal 922 is positioned in the middle aperture 918. As shown in FIGS. 24 and 25, the middle terminals 922 are ganged together via a circuit rail 924. Outboard terminals 920 are not ganged together and are available for individual connection. FIGS. 26 through 28 illustrate another embodiment of an outlet connector bank 1000 similar to that described with respect to FIGS. 23 through 25. However, in this embodiment the outboard terminals 1020 are ganged together via corresponding circuit rails 1026. Middle terminals 1022 are ganged together via circuit rail 1024. Outboard terminals 1020 extend through apertures 1016 while middle terminal 1022 extends through aperture 1018. Although the outlet connector banks described with respect to FIGS. 25 through 28 describe ganging at least some of the terminals together, in other embodiments all of the terminals may be left unganged.

Figure 29:
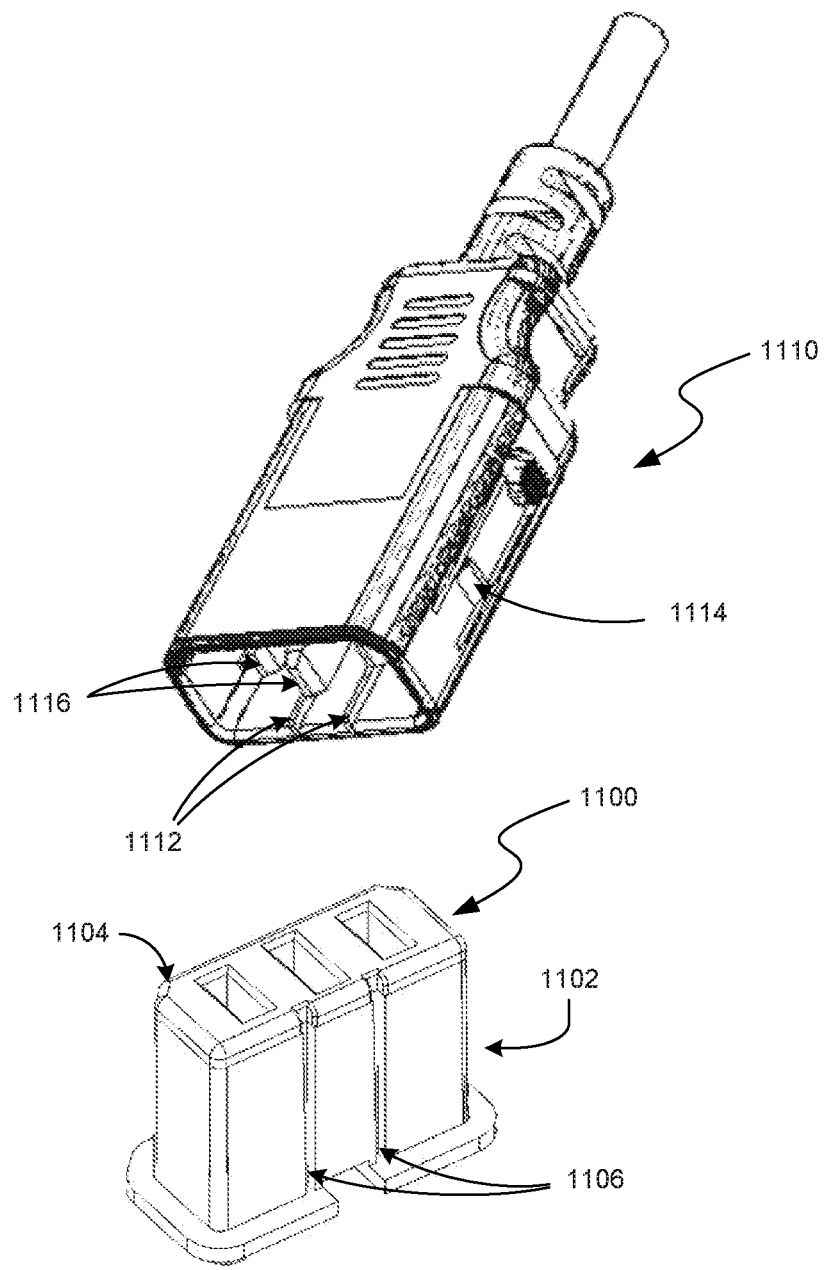
FIG. 29 is a perspective view illustrating an outlet connector and mating plug according to another representative embodiment.

Outlet connector 1100 shown in FIG. 29 includes an outlet core 1102 and an end cap 1104 connected to the outlet core. In this embodiment, the outlet core 1102 and the end cap 1104 include a pair of grooves or channels 1106 to help ensure that plug 1110 is properly connected to the outlet connector 1100. Plug 1110 includes mating terminals 1116 and indexing rails 1112 configured to mate with channels 1106. Plug 1110 also includes retainers 1114 configured to engage slots 905 or openings 913 (see FIG. 22).

Embodiments described herein provide several benefits relative to traditional PDUs having outlets that include an outer jacket around an outlet core. By removing the outer jacket typically included with a C13 or C19 receptacle, for example, the core element of the power receptacle remains and allows for reduced possible spacing of receptacles, thus allowing for increased or maximized receptacle density. Such core receptacles can be mounted on a PCB, sheet metal, or molded into a multi receptacle (ganged) module, according to various embodiments, providing flexibility in the configuration and manufacturing of such PDUs. Additionally, core receptacles can be mounted in single or dual rows, in any orientation, to further increase density. Furthermore, such enhanced density in PDU outlets can provide reduced PDU volume, while also appropriately configured cord plugs including custom plug configurations and industry standard power cords and providing optional locking for power cords. In embodiments where the outlets extend away from the PDU housing, either through a recessed surface or a rotatable connection, additional flexibility and versatility are provided to users of PDUs, because, for example, the outlets can be uniformly spaced along the length of the PDU, which is desirable in that interconnecting power cords to equipment located in an equipment rack can then be the same length. PDUs such as those described herein, according to various embodiments, provide several advantages over traditional PDUs. For example, high outlet density PDUs may contain the maximum possible number of outlets per unit volume, which equates to maximum or increased value to a PDU customer or user. High outlet density PDUs may work with industry standard power cords, thus requiring no additional cost that is incurred when put into service. High outlet density PDUs may have a smaller volume than conventional outlet PDU's, and can thus be installed into a wider variety of commercially available equipment racks. High outlet density PDUs allow construction of an air tight enclosure, which can then be actively, cooled using forced air or other fluids. High outlet density PDUs allow for modular, highly variable assembly methodologies, not easily achieved with conventional outlets. It will be noted that this list of various advantages is not exhaustive or exclusive, and numerous different advantages and efficiencies may be achieved, as will be recognized by one of skill in the art.

It should be noted that the systems and devices discussed above are intended merely to be examples. It must be stressed that various embodiments may omit, substitute, or add various procedures or components as appropriate. For instance, it should be appreciated that, in alternative embodiments, features described with respect to certain embodiments may be combined in various other embodiments. Different aspects and elements of the embodiments may be combined in a similar manner. Also, it should be emphasized that technology evolves and, thus, many of the elements are exemplary in nature and should not be interpreted to limit the scope of the invention.

Specific details are given in the description to provide a thorough understanding of the embodiments. However, it will be understood by one of ordinary skill in the art that the embodiments may be practiced without these specific details. For example, well-known circuits, structures, and techniques have been shown without unnecessary detail in order to avoid obscuring the embodiments.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be undertaken before, during, or after the above elements are considered. Accordingly, the above description should not be taken as limiting the scope of the invention.

We claim:

1. An outlet connector bank, comprising:
a unitary body including:
a recessed surface;
a sidewall surrounding said recessed surface; and
a plurality of outlet cores extending from said recessed surface, each of said outlet cores including a plurality of apertures and a lower flange which is disposed on the recessed surface; and
a plurality of terminals each positioned in a corresponding one of the plurality of apertures.

2. The outlet connector bank of claim 1 wherein said plurality of outlet cores are arranged in an array.

3. The outlet connector bank of claim 1 wherein selected ones of the terminals of the array of outlet cores are electrically ganged together.

4. The outlet connector bank of claim 1 wherein said unitary body comprises a one-piece molded plastic construction.

5. The outlet connector bank of claim 1 wherein said outlet cores are integral with said recessed surface.

6. The outlet connector bank of claim 1 wherein said sidewall includes an associated sidewall flange.

7. The outlet connector bank of claim 1 wherein said recessed surface is a base of the unitary body and is comprised of non-electrically conductive material.

8. A power distribution unit, comprising:
a housing;
at least one power input coupled with said housing and connectable to an associated external power source;
at least one outlet bank located at least partially within said housing, said at least one outlet bank comprising a unitary body comprising a one-piece molded plastic construction, said unitary body including:
a recessed surface;
a sidewall surrounding said recessed surface; and
a plurality of outlet cores extending from said recessed surface, each of said outlet cores including a plurality of apertures and adapted to accommodate an associated electrical plug;
a plurality of terminals each positioned in a corresponding one of the plurality of apertures; and
at least one plug retention edge associated with each of said cores, said at least one plug retention edge located inwardly of said surrounding sidewall and separate from said unitary body, each plug retention edge adapted to engage a plug retention tab on an associated electrical plug to resist removal of said electrical plug when coupled to its associated outlet core.

9. The power distribution unit of claim 8 wherein said housing includes at least one aperture for accommodating said at least one outlet connector bank.

10. The power distribution unit of claim 8 wherein said plurality of outlet cores are organized as an array, and wherein selected ones of the terminals of the array of outlet cores are electrically ganged together.

11. The power distribution unit of claim 8 wherein housing has a vertical form factor.

12. The power distribution unit of claim 8 wherein said housing has a horizontal form factor.

13. The power distribution unit of claim 8 wherein each of said outlet cores is integral with said recessed surface.

14. The power distribution unit of claim 8 wherein each of said outlet cores includes a flange which is disposed on said recessed surface.

15. The power distribution unit of claim 8 wherein said at least one plug retention edge is part of a lip which extends over a portion of said recessed surface.

16. The power distribution unit of claim 15 wherein said lip is coextensive with at least a portion of said sidewall.

17. A power distribution unit, comprising:
a housing;
at least one power input coupled with said housing and connectable to an associated external power source;
at least one outlet bank located at least partially within said housing, said at least one outlet bank comprising a unitary body including:
a recessed surface;
a sidewall surrounding said recessed surface; and
a plurality of outlet cores extending from said recessed surface, each of said outlet cores including a plurality of apertures and an associated flange which is disposed on said recessed surface;
a plurality of terminals each positioned in a corresponding one of the plurality of apertures; and
at least one lip projecting toward at least one of said plurality of outlet cores.

* * * * *